US012800691B2

(12) United States Patent
Tsubata et al.

(10) Patent No.: US 12,800,691 B2
(45) Date of Patent: Nov. 17, 2026

(54) SENSOR POSITION DETERMINATION METHOD

(71) Applicants: SUBARU CORPORATION, Tokyo (JP); JAPAN AEROSPACE EXPLORATION AGENCY, Tokyo (JP)

(72) Inventors: Hiroyuki Tsubata, Tokyo (JP); Hiromitsu Miyaki, Tokyo (JP); Takao Okada, Tokyo (JP)

(73) Assignees: SUBARU CORPORATION, Tokyo (JP); JAPAN AEROSPACE EXPLORATION AGENCY, Tokyo (JP)

( * ) Notice: Subject to any disclaimer, the term of this patent is extended or adjusted under 35 U.S.C. 154(b) by 170 days.

(21) Appl. No.: 19/014,853

(22) Filed: Jan. 9, 2025

(65) Prior Publication Data

US 2025/0237728 A1 Jul. 24, 2025

(30) Foreign Application Priority Data

Jan. 19, 2024 (JP) ................................ 2024-007041

(51) Int. Cl.
*G01R 35/00* (2006.01)
*B64D 45/02* (2006.01)
*G01R 29/08* (2006.01)

(52) U.S. Cl.
CPC ........... *G01R 35/005* (2013.01); *B64D 45/02* (2013.01); *G01R 29/0842* (2013.01)

(58) Field of Classification Search
CPC .. G01R 35/005; G01R 29/0842; G01R 29/14; G01R 31/001; B64D 45/02; G06F 30/15; G06F 30/20; G06F 2119/02
See application file for complete search history.

(56) References Cited

U.S. PATENT DOCUMENTS 8,405,405 B2 * 3/2013 Tsironis ............. G01R 29/0878 324/750.01
10,677,612 B2 6/2020 Nikic
(Continued)

FOREIGN PATENT DOCUMENTS

| | | | |
|---|---|---|---|
| CN | 102799112 | A | 11/2012 |
| CN | 112464361 | A | 3/2021 |
| JP | 2021-133860 | A | 9/2021 |

OTHER PUBLICATIONS

Extended European Search Reported dated Mar. 17, 2025, from corresponding EP Application No. 25151082.2, 6 pages.

*Primary Examiner* — Giovanni Astacio-Oquendo
(74) *Attorney, Agent, or Firm* — Rimon P.C.

(57) ABSTRACT

A sensor position determination method determines an installation position of an electric field sensor that detects electric field strength generated on a surface of an airframe of an aircraft. The sensor position determination method includes: acquiring the electric field strength at each of candidate positions at determined relative pitch angle and relative roll angle by electrostatic field analysis; repeating the acquisition of the electric field strength at each of the candidate positions by changing at least one of the relative pitch angle and the relative roll angle, each time the at least one of the relative pitch angle and the relative roll angle is changed; and identifying a candidate position having a relatively large variance of the acquired electric field strength, and setting the identified candidate position as the installation position of the electric field sensor.

4 Claims, 16 Drawing Sheets

(56) References Cited

U.S. PATENT DOCUMENTS

| | | | | |
|---|---|---|---|---|
| 11,338,939 | B2 * | 5/2022 | Carberry | B23P 19/04 |
| 12,055,616 | B2 * | 8/2024 | Wei | G01R 29/0878 |

* cited by examiner

SENSOR POSITION DETERMINATION METHOD

CROSS-REFERENCE TO RELATED APPLICATIONS

The present application claims priority from Japanese Patent Application No. 2024-007041 filed on Jan. 19, 2024, the entire contents of which are hereby incorporated by reference.

The present disclosure relates to a sensor position determination method for determining an installation position of an electric field sensor.

For example, Japanese Unexamined Patent Application Publication (JP-A) No. 2021-133860 discloses that an electric field sensor that detects electric field strength generated on a surface of an airframe is provided in the airframe of an aircraft. In such a technique, a distribution of surface electric field strength of the aircraft is derived based on a detection result of the electric field sensor, and an attitude of the aircraft is controlled using the distribution of the surface electric field strength, so that an influence of the lightning strike can be prevented.

SUMMARY

An aspect of the disclosure provides a sensor position determination method for determining an installation position of an electric field sensor that detects electric field strength generated on a surface of an airframe of an aircraft. The sensor position determination method includes: setting an airframe shape model that simulates a shape of the airframe in an analysis space in which an electrostatic field analysis is performed; setting a candidate positions serving as candidates for the installation position of the electric field sensor in the airframe shape model; setting flat parallel electrodes that generate an electric field in the analysis space to sandwich the airframe shape model therebetween; determining a relative pitch angle indicating a relative pitch angle of the airframe shape model relative to the parallel electrodes and a relative roll angle indicating a relative roll angle of the airframe shape model relative to the parallel electrodes; acquiring the electric field strength at each of the candidate positions at the determined relative pitch angle and relative roll angle by the electrostatic field analysis; repeating the acquisition of the electric field strength at each of the candidate positions by changing at least one of the relative pitch angle and the relative roll angle, each time the at least one of the relative pitch angle and the relative roll angle is changed; and identifying, from among the candidate positions, a candidate position having a relatively large variance of the electric field strength acquired each time the at least one of the relative pitch angle and the relative roll angle is changed, and setting the identified candidate position as the installation position of the electric field sensor.

BRIEF DESCRIPTION OF DRAWINGS

The accompanying drawings are included to provide a further understanding of the disclosure and are incorporated in and constitute a part of this specification. The drawings illustrate embodiments and, together with the specification, serve to describe the principles of the disclosure.

DETAILED DESCRIPTION

In JP-A No. 2021-133860, in order to reduce an installation cost and an operation cost of the electric field sensor, a small number of electric field sensors are installed on the aircraft, and an electric field distribution table illustrating a reference electric field distribution is prepared in advance. Further, in JP-A No. 2021-133860, the distribution of surface electric field strength at a plurality of positions is estimated based on detection results of the small number of electric field sensors and the electric field distribution table.

However, depending on positions where the small number of electric field sensors are installed, accuracy of the electric field strength detected by the electric field sensors may be reduced. When the accuracy of the electric field strength is reduced, the surface electric field strength distribution cannot be appropriately estimated. For these reasons, it is necessary to install the small number of electric field sensors in appropriate positions in the airframe.

Therefore, the present disclosure provides a sensor position determination method capable of determining an appropriate installation position of an electric field sensor.

Hereinafter, embodiments of the present disclosure will be described in detail with reference to the accompanying drawings. The specific dimensions, materials, numerical values, and the like illustrated in the embodiments are merely examples for facilitating the understanding of the disclosure, and do not limit the present disclosure unless otherwise specified. In the present description and the drawings, elements having substantially the same functions and configurations are denoted by the same reference signs, and a repeated description thereof is omitted, and elements having no direct relation with the present disclosure are omitted.

Figure 1:
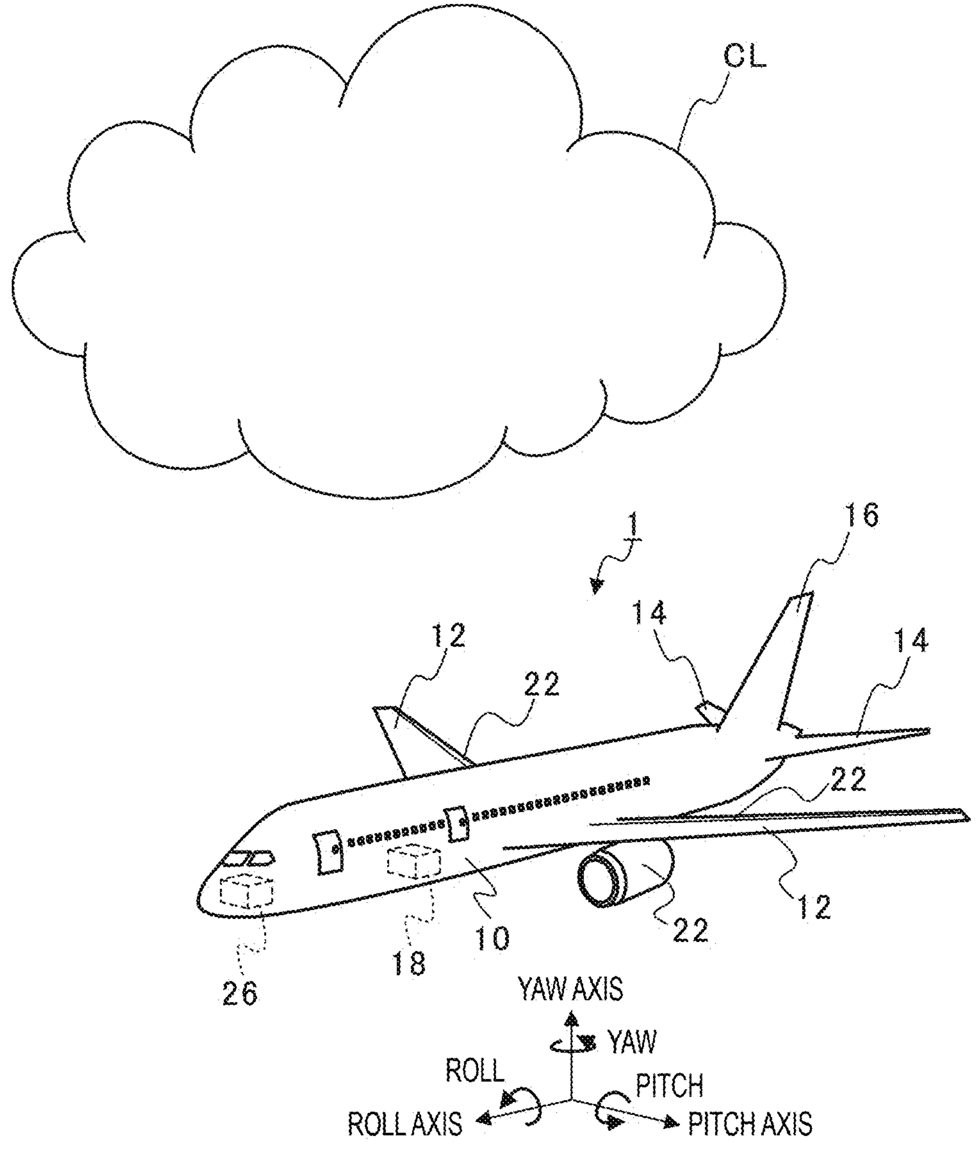
FIG. 1 is a schematic perspective view of an aircraft.

FIG. 1 is a schematic perspective view of an aircraft 1. As illustrated in FIG. 1, the aircraft 1 includes a fuselage 10, main wings 12, horizontal stabilizers 14, a vertical stabilizer 16, an attitude sensor 18, flight mechanisms 22, and a flight control device 26. Here, although a passenger plane is illustrated as an example of the aircraft 1, various machines that fly in the atmosphere can be used.

The fuselage 10 extends in a roll axis direction connecting a nose side and a tail side of the aircraft 1. The main wings 12, the horizontal stabilizers 14, and the vertical stabilizer 16 are fixed to the fuselage 10 and contribute to stable flight of the aircraft 1. The main wings 12 extend from the fuselage 10 in a pitch axis direction perpendicular to a roll axis, near a center of the fuselage 10 in the roll axis direction. The horizontal stabilizers 14 extend from the fuselage 10 in the pitch axis direction near a tail of the fuselage 10. The vertical stabilizer 16 extends from the fuselage 10 in a yaw axis direction perpendicular to the roll axis and a pitch axis near the tail.

Rotation about the roll axis may be referred to as a roll, and a rotation angle about the roll axis may be referred to as a roll angle. Rotation around the pitch axis may be referred to as a pitch, and a rotation angle around the pitch axis may be referred to as a pitch angle. Rotation about a yaw axis may be referred to as yaw, and a rotation angle about the yaw axis may be referred to as yaw. The pitch angle corresponds to a nose angle, the roll angle corresponds to a bank angle, and a yaw angle corresponds to a flight azimuth.

The attitude sensor 18 includes, for example, an inertial measurement unit (IMU), and detects an airframe attitude of the aircraft 1.

The flight mechanisms 22 include fixed wings such as the main wings 12, the horizontal stabilizers 14, and the vertical stabilizer 16, and internal combustion engines (for example, jet engines or reciprocating engines) that obtain a thrust, and the thrust generates lift force around the wings, thereby keeping the airframe suspended in the atmosphere. However, a mechanism that generates the lift force is not limited to such a case, and it is also possible to obtain the lift force or the thrust from rotary wings (rotors) provided rotatably. The flight mechanisms 22 can also control the airframe attitude, the flight azimuth (yaw angle), a height, and a flight speed by controlling the nose angle (pitch angle) and the bank angle (roll angle) through an elevator and an aileron, and by adjusting outputs of the internal combustion engines and the like.

The flight control device 26 includes a semiconductor integrated circuit including a central processing unit (CPU), a ROM in which a program and the like are stored, a RAM as a work area, and the like. The flight control device 26 achieves various functions related to the flight of the aircraft 1 in cooperation with a program. For example, the flight control device 26 performs various processes depending on detection results of various sensors such as the attitude sensor 18. The flight control device 26 receives an operation input of a pilot controlling the aircraft 1 and controls the flight mechanism 22 to maintain the flight of the aircraft 1.

In an example of FIG. 1, it is assumed that the aircraft 1 is flying near a low portion of a cloud CL that is negatively charged, for example. In this example, due to an influence of an electric field (for example, electrostatic induction) caused by negative charge of the cloud CL, an upper side of the airframe of the aircraft 1 is polarized to a positive pole, and a lower side of the airframe of the aircraft 1 is polarized to a negative pole.

Depending on a relative positional relationship between the aircraft 1 and the cloud CL, a part where positive charge or negative charge is partially concentrated may be generated in the airframe of the aircraft 1. A strong electric field generated at the part where the positive charge or negative charge is concentrated causes dielectric breakdown in the atmosphere, causing the charge from the airframe to leak into the atmosphere in the form of streamers and leaders. Further, charge that can no longer be held by the cloud CL will move toward the part where such positive charge or negative charge is biased, and there is a risk that a leader from the cloud CL will be coupled to a leader extending from the airframe, causing a discharge. In this way, lightning strike may occur in the aircraft 1.

Here, for example, it is conceivable that the surface electric field strength of the aircraft 1 is acquired, and the acquired surface electric field strength is used for controlling the attitude of the aircraft 1 and preventing the influence of the lightning strike. As a method for acquiring the surface electric field strength, electric field sensors that detect the electric field strength of a surface of the airframe of the aircraft 1 may be installed in parts of the aircraft 1. However, when the electric field sensors are installed at all parts of the airframe, installation costs and operating costs are inevitably increased.

Here, a small number of electric field sensors are installed in the airframe, and an electric field distribution table indicating a reference electric field distribution is prepared in advance. Further, it is conceivable to estimate a distribution of surface electric field strength at a plurality of positions, including positions other than positions where the electric field sensors are installed, based on detection results of the small number of electric field sensors installed in the airframe and the electric field distribution table prepared in advance.

However, depending on the positions where the small number of electric field sensors are installed, accuracy of the electric field strength detected by the electric field sensors may be reduced. When the accuracy of the electric field strength is reduced, the surface electric field strength distribution cannot be appropriately estimated. For these reasons, it is necessary to install the small number of electric field sensors in appropriate positions in the airframe.

Therefore, the present embodiment discloses a sensor position determination method for determining an installation position of an electric field sensor that detects electric field strength generated on a surface of the airframe of the aircraft 1. By using the sensor position determination method according to the present embodiment, appropriate installation positions of the small number of electric field sensors can be determined. As a result, by actually mounting the electric field sensor at the installation position determined by using the sensor position determination method according to the present embodiment and performing attitude control of the aircraft 1 based on a detection result of the electric field sensor during operation of the aircraft 1, the influence of the lightning strike can be prevented.

Figure 2:
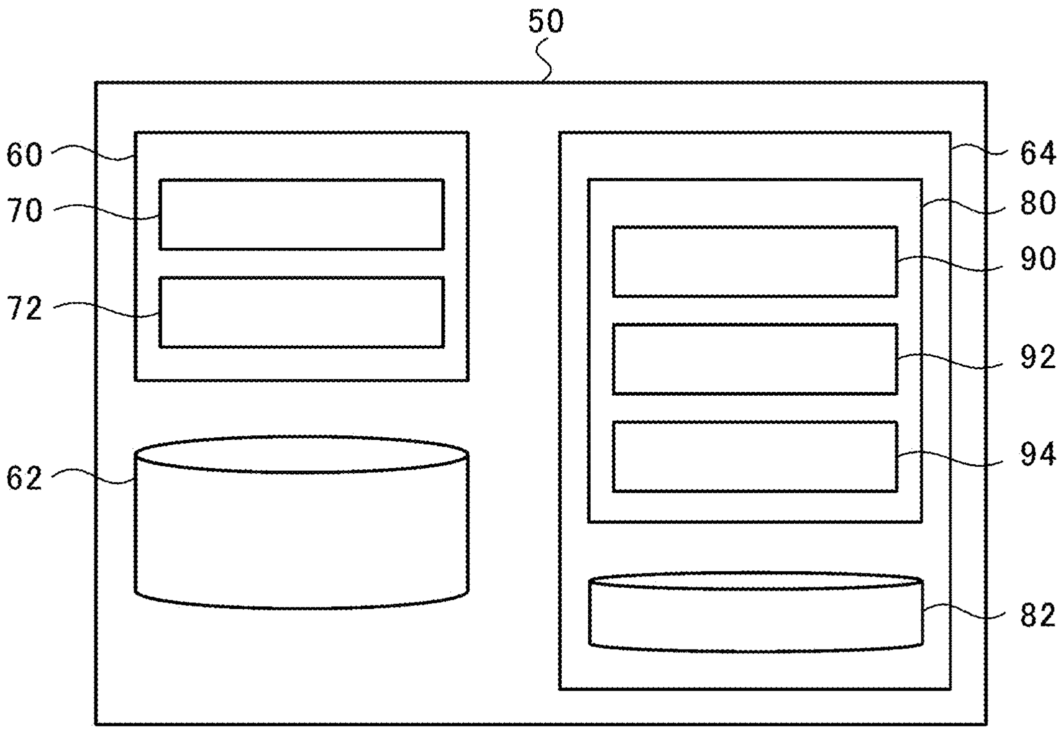
FIG. 2 is a schematic diagram illustrating a configuration of an analysis device that achieves the sensor position determination method according to the present embodiment.

FIG. 2 is a schematic diagram illustrating a configuration of an analysis device 50 that achieves the sensor position determination method according to the present embodiment. The analysis device 50 is, for example, a computer such as a personal computer. The analysis device 50 includes a user interface 60, a storage device 62, and an arithmetic device 64.

The user interface 60 includes a display device 70 and an input device 72. The display device 70 is, for example, a liquid crystal display or an organic EL display, and displays various kinds of images and information. In addition to the display device 70, the user interface 60 may include an output device that presents various kinds of information to a user, such as a speaker. The input device 72 includes, for example, a keyboard or a mouse, and receives an input operation of the user.

The storage device 62 includes a non-volatile storage element. The storage device 62 may be formed by a non-volatile storage element such as a flash memory that can be electrically read and written. The storage device 62 stores various kinds of data used for various processes executed by the analysis device 50.

The arithmetic device 64 includes one or processors 80 and one or memories 82 coupled to the processors 80. The memory 82 includes a ROM in which a program and the like are stored, and a RAM as a work area. The processor 80 executes various processes in cooperation with a program in the memory 82. In the embodiment of the present disclosure, the processor 80 also serves as an analysis pre-processing unit 90, a first analysis processing unit 92, and a second analysis processing unit 94 by executing the program.

The analysis pre-processing unit 90 executes pre-processing for first analysis processing and first reference position analysis processing executed by the first analysis processing unit 92 and second analysis processing and second reference position analysis processing executed by the second analysis processing unit 94. After the pre-processing, the first analysis processing unit 92 executes the first analysis processing and the first reference position analysis processing. After the pre-processing, the second analysis processing unit 94 executes the second analysis processing and the second reference position analysis processing. The first analysis processing is processing for determining the installation position of the electric field sensor suitable for preventing the influence of the lightning strike by controlling the attitude of the aircraft 1 in a pitch direction. Since the surface of the airframe of the aircraft 1 is constantly charged during flight, when the attitude control is performed to reduce the influence of the lightning strike, it is preferable to detect a level of this charged component and perform the attitude control by taking this charged component into consideration. The first reference position analysis processing is processing for determining an installation position of a reference electric field sensor suitable for acquiring the charged component of the aircraft 1 when the aircraft 1 performs the attitude control in the pitch direction to reduce the influence of the lightning strike. The second analysis processing is processing for determining the installation position of the electric field sensor suitable for preventing the influence of the lightning strike by controlling the attitude of the aircraft 1 in a roll direction. The second reference position analysis processing is processing for determining the installation position of the reference electric field sensor suitable for acquiring the charged component of the aircraft 1 when the aircraft 1 performs the attitude control in the roll direction to reduce the influence of the lightning strike. Hereinafter, the pre-processing, the first analysis processing, and the second analysis processing will be described in detail.

Figure 3:
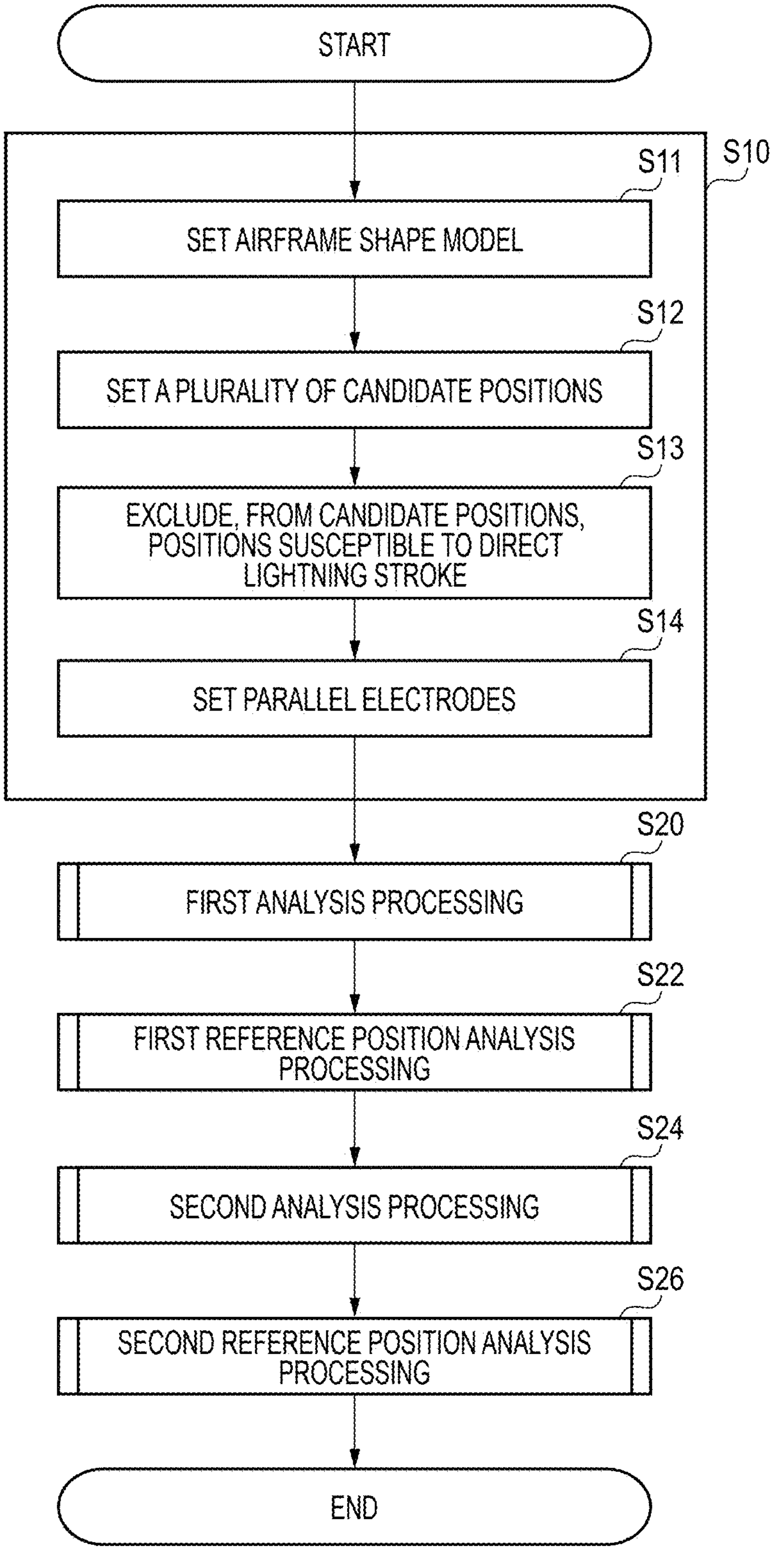
FIG. 3 is a flowchart illustrating a flow of an operation of an arithmetic device.

FIG. 3 is a flowchart illustrating a flow of an operation of the arithmetic device 64. For example, when the arithmetic device 64 receives a start signal instructing a start of the processing for determining the installation position of the electric field sensor through the input device 72, the arithmetic device 64 executes a series of processing illustrated in FIG. 3. When the start signal is received, the analysis pre-processing unit 90 of the arithmetic device 64 executes pre-processing (S10).

In the pre-processing (S10), the analysis pre-processing unit 90 first sets an airframe shape model simulating a shape of the airframe in an analysis space in which an electrostatic field analysis is performed (S11). Next, the analysis pre-processing unit 90 sets candidate positions that are candidates for the installation position of the electric field sensor in the airframe shape model (S12). Next, the analysis pre-processing unit 90 excludes, from the candidate positions, positions susceptible to direct lightning stroke in the airframe shape model (S13). The positions that are susceptible to the direct lightning stroke may be determined in advance by an experiment, an analysis, or the like. Next, the analysis pre-processing unit 90 sets flat parallel electrodes that generate an electric field in the analysis space so as to sandwich the airframe shape model therebetween (S14).

Here, an example in which the setting of the parallel electrodes is performed after the setting of the airframe shape model has been described. However, the setting of the airframe shape model may be performed after the setting of the parallel electrodes.

Figure 4:
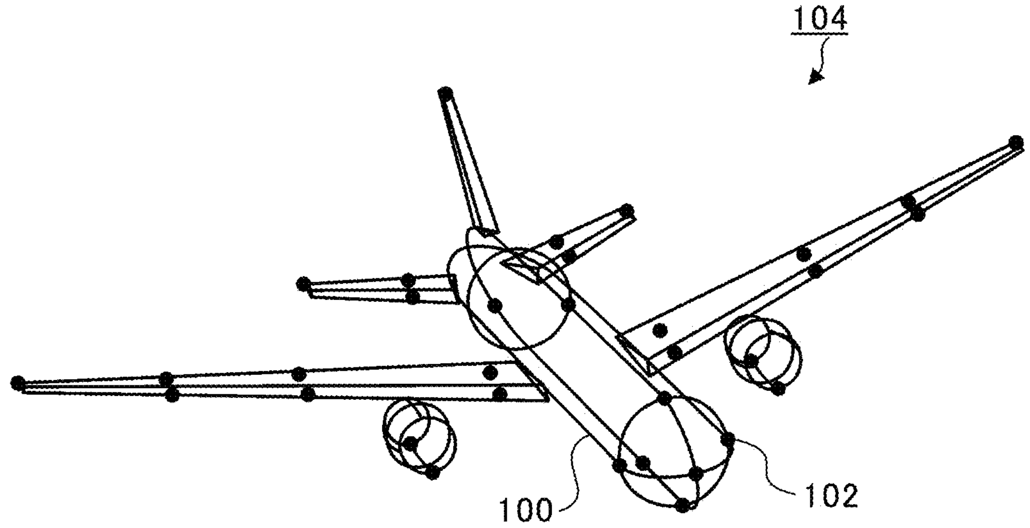
FIG. 4 is a diagram illustrating an example of an airframe shape model and a candidate positions.

FIG. 4 is a diagram illustrating an example of the airframe shape model 100 and candidate positions 102. As illustrated in FIG. 4, the airframe shape model 100 is created by simulating a shape of an entire surface of the airframe. The airframe shape model 100 is disposed in an analysis space 104 so as to simulate a state in which the airframe is floating. The airframe shape model 100 is used as a floating conductor and is used for the electrostatic field analysis to be described later.

In FIG. 4, the candidate positions 102 are indicated by black circles. The candidate positions 102 are respectively set in the fuselage 10, the main wings 12, the horizontal stabilizers 14, and the vertical stabilizer 16. The candidate positions 102 and the number thereof are not limited to positions and the number illustrated in FIG. 4, and can be set in consideration of a structure, a scale, and the like of the aircraft 1. For example, the analysis pre-processing unit 90 may set the candidate positions 102 by analyzing the airframe shape model 100. Further, the user of the analysis device 50 may set the candidate positions 102 through the input device 72.

As described above, the analysis pre-processing unit 90 excludes the positions in the airframe shape model 100 that are susceptible to the direct lightning stroke from the candidate positions 102. In other words, the electric field sensor is not installed at the position that is susceptible to the direct lightning stroke.

The positions that are susceptible to the direct lightning stroke are, for example, end portions, such as wing tips, of the aircraft 1. For example, the analysis pre-processing unit 90 excludes, from the candidate positions 102, tips of the main wings 12 in the pitch axis direction, tips of the horizontal stabilizers 14 in the pitch axis direction, a tip of the vertical stabilizer 16 in the yaw axis direction, a tip of the nose, and the like as the positions susceptible to the direct lightning stroke. Accordingly, it is possible to reduce a risk of the electric field sensor being damaged by the direct lightning stroke.

In the pre-processing, the process of excluding the positions that are susceptible to the direct lightning stroke from the candidate positions 102 may not be performed. That is, the positions that are susceptible to the direct lightning stroke may also be included in the candidate positions 102. In this case, the positions that are susceptible to the direct lightning stroke may be identified as the installation positions of the electric field sensors. If the electric field sensor is installed at the position susceptible to the direct lightning stroke, there is a high possibility that the electric field sensor is damaged by the direct lightning stroke. However, the electric field strength can be detected by the electric field sensor until the electric field sensor is damaged, and it is possible to determine whether the airframe is at high risk of being hit by the direct lightning stroke based on the detected electric field strength. In the case of a design concept in which it is desired to detect the electric field strength with high accuracy until the position is subjected to the direct lightning stroke, the process of excluding the positions susceptible to the direct lightning stroke from the candidate positions 102 may not be performed. On the other hand, in the case of a design concept in which it is desired to reduce costs and effort required to repair an electric field sensor that has been damaged by the direct lightning stroke, the process of excluding the positions susceptible to the direct lightning stroke from the candidate positions 102 may be performed.

Figure 5:
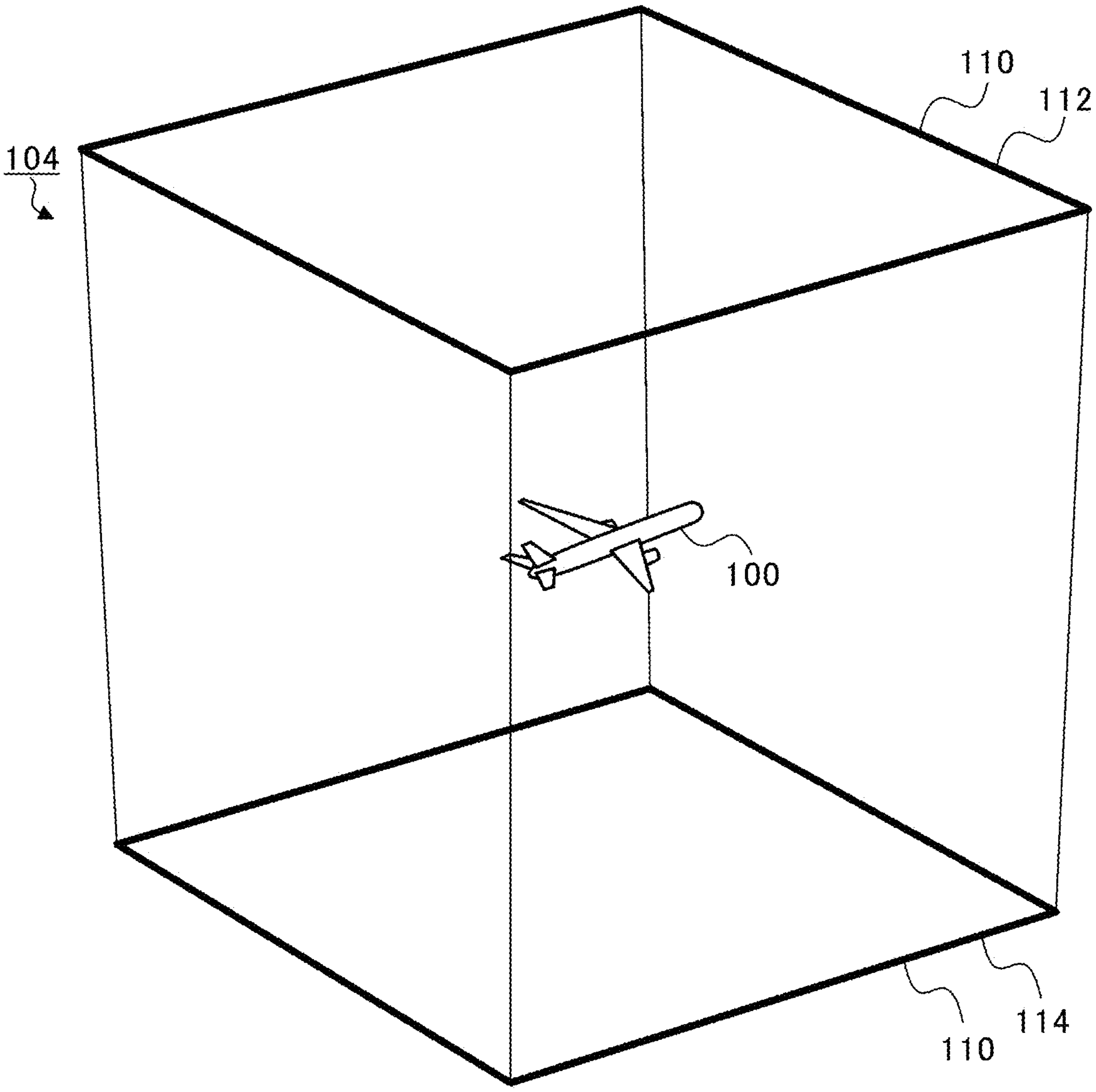
FIG. 5 is a diagram illustrating an example of setting of parallel electrodes.

FIG. 5 is a diagram illustrating an example of setting of the parallel electrodes 110. As illustrated in FIG. 5, the parallel electrodes 110 include an upper electrode 112 and a lower electrode 114. The upper electrode 112 is disposed, for example, above the analysis space 104. The lower electrode 114 is disposed, for example, below the analysis space 104. The upper electrode 112 and the lower electrode 114 extend, for example, in plane and are disposed opposite to each other and parallel to each other. The airframe shape model 100 is located between the upper electrode 112 and the lower electrode 114. That is, the parallel electrodes 110 are set so as to sandwich the airframe shape model 100 therebetween. Further, an area of a plane of the upper electrode 112 is larger than a projected area when the airframe shape model 100 is projected onto the upper electrode 112, and an area of a plane of the lower electrode 114 is larger than a projected area when the airframe shape model 100 is projected onto the lower electrode 114. A relationship between a size of the analysis space 104 and a size of the airframe shape model 100 is set to be a relationship so that the analysis can be appropriately performed.

During the electrostatic field analysis after the pre-processing, a positive potential is applied to the upper electrode 112 and a negative potential is applied to the lower electrode 114. Further, a potential linearly changing from the upper electrode 112 to the lower electrode 114 is applied to each side surface orthogonal to the upper electrode 112 and the lower electrode 114 in the analysis space 104. When such potentials are applied to the upper electrode 112, the lower electrode 114, and each side surface, the parallel electrodes 110 generate a parallel electric field in the analysis space 104 between the upper electrode 112 and the lower electrode 114.

Returning to FIG. 3, after the pre-processing (S10), the first analysis processing unit 92 executes the first analysis processing (S20) and the first reference position analysis processing (S22). Thereafter, the second analysis processing unit 94 executes the second analysis processing (S24) and the second reference position analysis processing (S26), and the series of processing illustrated in FIG. 3 ends.

Figure 6:
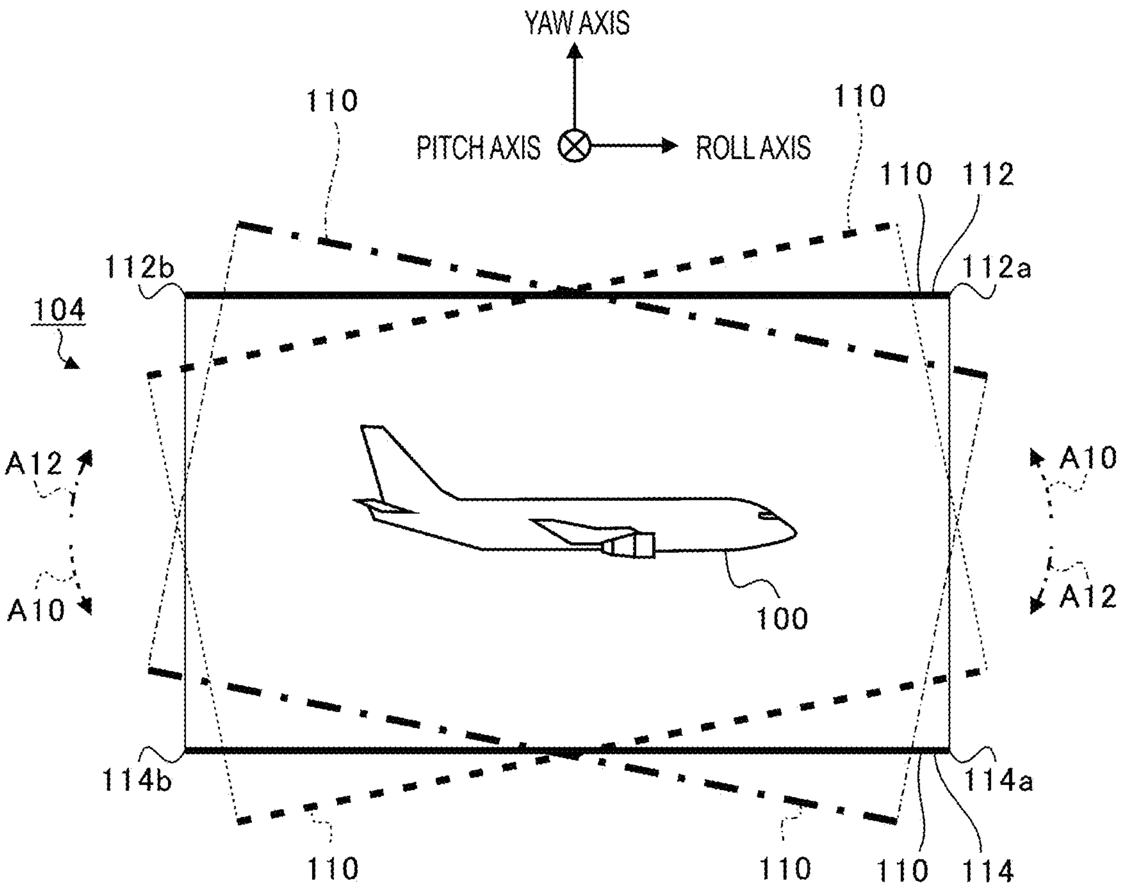
FIG. 6 is a diagram illustrating an outline of first analysis processing.

FIG. 6 is a diagram illustrating an outline of the first analysis processing (S20). FIG. 6 illustrates a state in which the airframe shape model 100 disposed in the analysis space 104 and the parallel electrodes 110 are viewed from a right wing side of the airframe. In FIG. 6, for convenience of description, the airframe shape model 100 is exaggerated and illustrated large relative to the size of the analysis space 104. Further, in FIG. 6, for convenience of description, the roll axis, the pitch axis, and the yaw axis of the airframe shape model 100 are also illustrated.

Hereinafter, a relative pitch angle of the airframe shape model 100 relative to the parallel electrodes 110 may be referred to as a relative pitch angle. A relative roll angle of the airframe shape model 100 with respect to the parallel electrodes 110 may be referred to as a relative roll angle. A relative yaw angle of the airframe shape model 100 with respect to the parallel electrodes 110 may be referred to as a relative yaw angle.

In the example of FIG. 6, the parallel electrodes 110 indicated by thick solid lines are arranged parallel to the pitch axis and the roll axis of the airframe shape model 100. At this time, the relative pitch angle of the airframe shape model 100 with respect to the parallel electrodes 110 is zero.

Here, it is assumed that a position of the airframe shape model 100 is fixed, and the parallel electrodes 110 are rotated counterclockwise in FIG. 6 by a predetermined angle (for example, 10°) around the pitch axis at a center of the analysis space 104 as a center of rotation as indicated by dashed arrows A10. An example of the parallel electrodes 110 at that time is indicated by a thick dashed line in FIG. 6. In this state, a nose side end 112*a* of the upper electrode 112 and a nose side end 114*a* of the lower electrode 114 are moved upward, and a tail side end 112*b* of the upper electrode 112 and a tail side end 114*b* of the lower electrode 114 are moved downward. In this case, when the rotated thick-dashed parallel electrodes 110 are used as a reference, the relative pitch angle of the airframe shape model 100 becomes a value on a depression angle side of zero.

Here, it is assumed that the position of the airframe shape model 100 is fixed, and the parallel electrodes 110 are rotated clockwise in FIG. 6 by a predetermined angle (for example, 10°) around the pitch axis at the center of the analysis space 104 as the center of rotation as indicated by dot-dash-line arrows A12. An example of the parallel electrodes 110 at that time is indicated by thick dot-dash-lines in FIG. 6. In this state, the nose side end 112*a* of the upper electrode 112 and the nose side end 114*a* of the lower electrode 114 are moved downward, and the tail side end 112*b* of the upper electrode 112 and the tail side end 114*b* of the lower electrode 114 are moved upward. In this case, when the rotated parallel electrodes 110 indicated by the thick dot-dash-lines are used as a reference, the relative pitch angle of the airframe shape model 100 is a value on an elevation angle side of zero.

In this manner, the relative pitch angle can be changed by rotating the parallel electrodes 110 around the pitch axis. Here, an example has been described in which the airframe shape model 100 is fixed and the parallel electrodes 110 are rotated, but the positions of the parallel electrodes 110 may be fixed and the airframe shape model 100 may be rotated around the pitch axis to change the relative pitch angle. However, in the electrostatic field analysis to be described later, for example, the analysis space 104 is divided into a mesh shape such that the analysis space 104 is divided into triangular tetrahedrons, and the analysis is performed by representing each position in the analysis space 104 by each tetrahedron. In this analysis, spatial coordinates of the tetrahedrons corresponding to the candidate positions 102 are used as the candidate positions 102. In the example in which the airframe shape model 100 is rotated, the tetrahedrons corresponding to the candidate positions 102 change one by one as the airframe shape model 100 is rotated, and thus the electrostatic field analysis is more time-consuming and complicated than the example in which the parallel electrodes 110 are rotated. Therefore, the example in which the parallel electrodes 110 are rotated is more preferable than the example in which the airframe shape model 100 is rotated.

In the first analysis processing, the relative roll angle and the relative yaw angle are fixed at predetermined values, respectively. The first analysis processing unit 92 extracts any four candidate positions 102 from the candidate positions 102, and creates a combination of the four candidate positions 102. Hereinafter, the number that constitutes a combination is sometimes called a combination constituting number. The combination constituting number is not limited to four, and may be set to any number equal to or greater than two.

The first analysis processing unit 92 determines the relative pitch angle to any value, generates the electric field between the parallel electrodes 110, and acquires the electric field strength at each candidate position 102 in the combination of the four candidate positions 102 by the electrostatic field analysis. Further, the first analysis processing unit 92 changes the relative pitch angle while maintaining the relative roll angle and the relative yaw angle at the predetermined values, and repeats the process of acquiring the electric field strength at each of the candidate positions 102 each time the relative pitch angle is changed. For example, the first analysis processing unit 92 changes the relative pitch angle by 1° while maintaining the relative roll angle and the relative yaw angle at zero. The relative pitch angle is not limited to being changed by 1°, and may be changed by any angle.

When these processes are performed, the electric field strength is obtained for each of the candidate positions 102 in the combination of the four candidate positions 102 for each relative pitch angle. The electric field strength at each candidate position 102 is different for each relative pitch angle.

The first analysis processing unit 92 derives a variance based on the electric field strength of each of the candidate positions 102 in the combination of the four candidate positions 102 at any relative pitch angle. The first analysis processing unit 92 repeats the derivation of this variance each time the relative pitch angle is changed. Further, the first analysis processing unit 92 adds variances derived each time the relative pitch angle is changed, to derive a sum of the variances each time the relative pitch angle is changed.

In one example, the first analysis processing unit 92 derives an average value by the following Formula (1), and uses the average value to derive the variance by the following Formula (2). In Formula (1) and Formula (2), a represents the average value. D1 indicates electric field strength of a first candidate position among the four candidate positions 102. D2 indicates electric field strength of a second candidate position among the four candidate positions 102. D3 indicates electric field strength of a third candidate position among the four candidate positions 102. D4 indicates electric field strength of a fourth candidate position among the four candidate positions 102. In Formula (2), s represents the variance.

$$a = (D1 + D2 + D3 + D4)/4 \tag{1}$$

$$s = \left((D1 - a)^2 + (D2 - a)^2 + (D3 - a)^2 + (D4 - a)^2\right)/4 \tag{2}$$

That is, the first analysis processing unit 92 subtracts the average value (a) of the electric field strength at the four candidate positions 102 that constitute the combination from electric field strength values (D1, D2, D3, D4) of the four candidate positions 102, respectively, squares resulting values, and averages the four squared values over the combination constituting number (4) to derive the variance.

The first analysis processing unit 92 changes the combination of the four candidate positions 102 and derives the sum of the variances for each combination of the candidate positions 102. The first analysis processing unit 92 derives the sum of the variances for all patterns of combinations of the four candidate positions 102.

Figure 7:
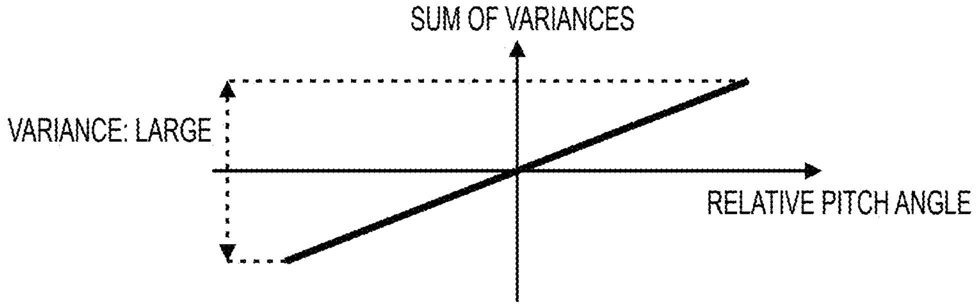
FIG. 7 is a diagram illustrating an example of a relationship between a relative pitch angle and a sum of variances.
Figure 8:
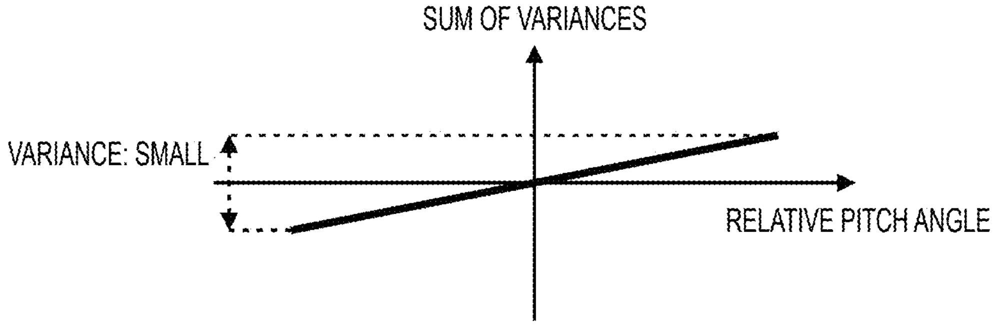
FIG. 8 is a diagram illustrating another example of the relationship between the relative pitch angle and the sum of the variances.

FIG. 7 is a diagram illustrating an example of a relationship between the relative pitch angle and the sum of the variances. FIG. 7 illustrates an example in which the sum of the variances with respect to the relative pitch angle is relatively large. FIG. 8 is a diagram illustrating another example of the relationship between the relative pitch angle and the sum of the variances. FIG. 8 illustrates an example in which the sum of the variances with respect to the relative pitch angle is relatively small.

The first analysis processing unit 92 identifies a combination of four candidate positions 102 that has the largest sum of variances with respect to the relative pitch angle, and sets each candidate position 102 that constitutes the identified combination of the four candidate positions 102 as the installation position of the electric field sensor.

The phrase that the sum of the variances is the largest means that if the electric field sensors are installed at the four candidate positions 102 that constitute that combination, it can be estimated that the electric field strength detected by the electric field sensors at the four candidate positions 102 has the most variable values. The phrase that the electric field strength of the electric field sensors varies the most corresponds to including both candidate positions 102 where high electric field strength can be detected and candidate positions 102 where low electric field strength can be detected. In this way, when the electric field sensors are installed at the four candidate positions 102, a resolution of the electric field sensors as a set of four electric field sensors can be made higher than that of other sets of four electric field sensors. Therefore, by setting each candidate position 102 that constitutes the combination of the candidate positions 102 having the largest sum of variances as the installation position of the electric field sensor, the installed electric field sensor can effectively detect the electric field strength.

Next, an outline of the first reference position analysis processing will be described. In the first reference position analysis processing, the relative roll angle and the relative yaw angle are fixed to predetermined values, respectively, and the relative pitch angle is determined to any value. In this state, the first analysis processing unit 92 generates the electric field between the parallel electrodes 110 and acquires the electric field strength at each of the candidate positions 102 by the electrostatic field analysis. Further, the first analysis processing unit 92 changes the relative pitch angle while maintaining the relative roll angle and the relative yaw angle at the predetermined values, and repeats the process of acquiring the electric field strength at each of the candidate positions 102 each time the relative pitch angle is changed. For example, the first analysis processing unit 92 changes the relative pitch angle by 1° while maintaining the relative roll angle and the relative yaw angle at zero. The relative pitch angle is not limited to being changed by 1°, and may be changed by any angle.

When these processes are performed, the electric field strength is acquired for each relative pitch angle at each candidate position 102. The electric field strength at each candidate position 102 is different for each relative pitch angle.

Figure 9:
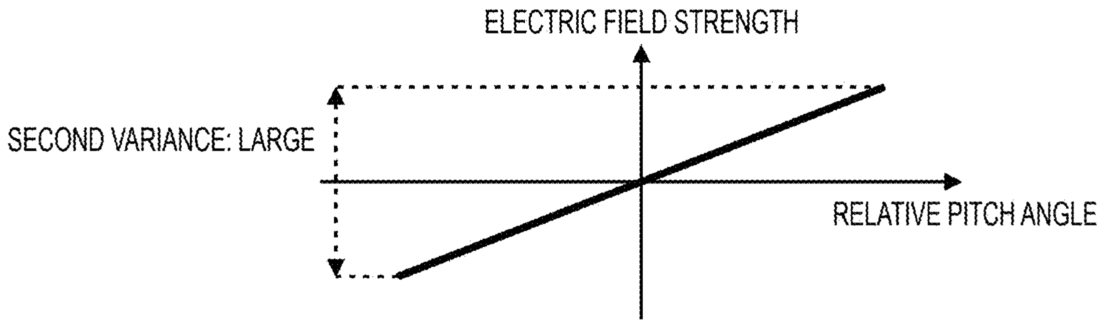
FIG. 9 is a diagram illustrating an example of a relationship between a relative pitch angle and electric field strength at one candidate position.
Figure 10:
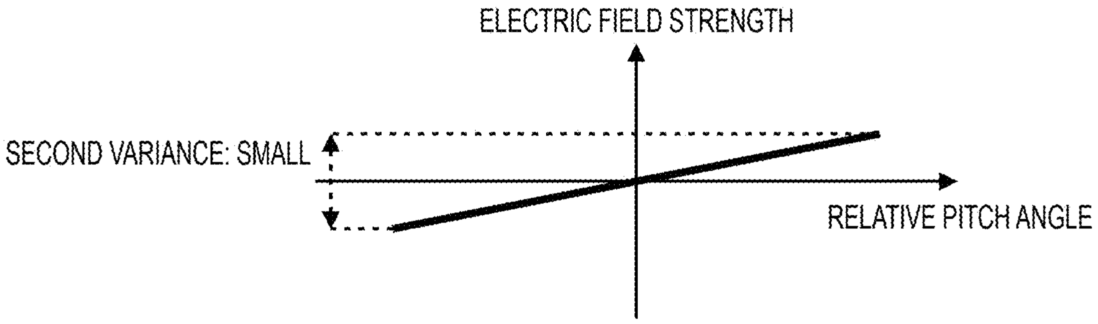
FIG. 10 is a diagram illustrating an example of a relationship between a relative pitch angle and electric field strength at another candidate position.

FIG. 9 is a diagram illustrating an example of a relationship between the relative pitch angle and the electric field strength at one candidate position 102. FIG. 10 is a diagram illustrating an example of the relationship between the relative pitch angle and the electric field strength at another candidate position 102.

Here, at any one of the candidate positions 102, a difference value obtained by subtracting a minimum value from a maximum value of the electric field strength acquired for each relative pitch angle and taking an absolute value is defined as a second variance of the electric field strength with respect to the relative pitch angle. In other words, the second variance of the electric field strength with respect to the relative pitch angle corresponds to amplitude of the electric field strength when the electric field strength is acquired by changing the relative pitch angle.

FIG. 9 illustrates an example in which the second variance of the electric field strength with respect to the relative pitch angle is relatively large. FIG. 10 illustrates an example in which the second variance of the electric field strength with respect to the relative pitch angle is relatively small.

The first analysis processing unit 92 may identify candidate positions 102 having a relatively small second variance of the electric field strength with respect to the relative pitch angle among the candidate positions 102, and may set the identified candidate positions 102 as the installation positions of the reference electric field sensors. The reference electric field sensor is an electric field sensor that detects reference electric field strength serving as a reference of the electric field strength.

The phrase that the second variance of the electric field strength is small means that if the reference electric field sensor is installed at that position, a change in the electric field strength detected by the reference electric field sensor is small even if the pitch angle of the aircraft 1 actually changes. In this case, the electric field strength detected by the reference electric field sensor can be made approximately constant within an allowable error range, regardless of an actual pitch angle of the aircraft 1. By using the electric field strength detected by this reference electric field sensor as the reference of the electric field strength, it becomes possible to more appropriately estimate the surface electric field strength distribution of the aircraft 1.

In one example, the first analysis processing unit 92 may identify a predetermined number of candidate positions 102 from those having the smallest second variance among the candidate positions 102, and determine the identified predetermined number of candidate positions 102 as the installation positions of the electric field sensors. By identifying the candidate positions 102 for the installation positions of the reference electric field sensors from those having the smallest second variance, it is possible to reduce fluctuation in the electric field strength detected by the reference electric field sensor, and it is possible to more appropriately estimate the surface electric field strength distribution.

The predetermined number here may be, for example, one. If there is at least one reference electric field strength, the surface electric field strength distribution can be appropriately estimated. The predetermined number is not limited to one, but may be set to any number equal to or greater than two.

Figure 11:
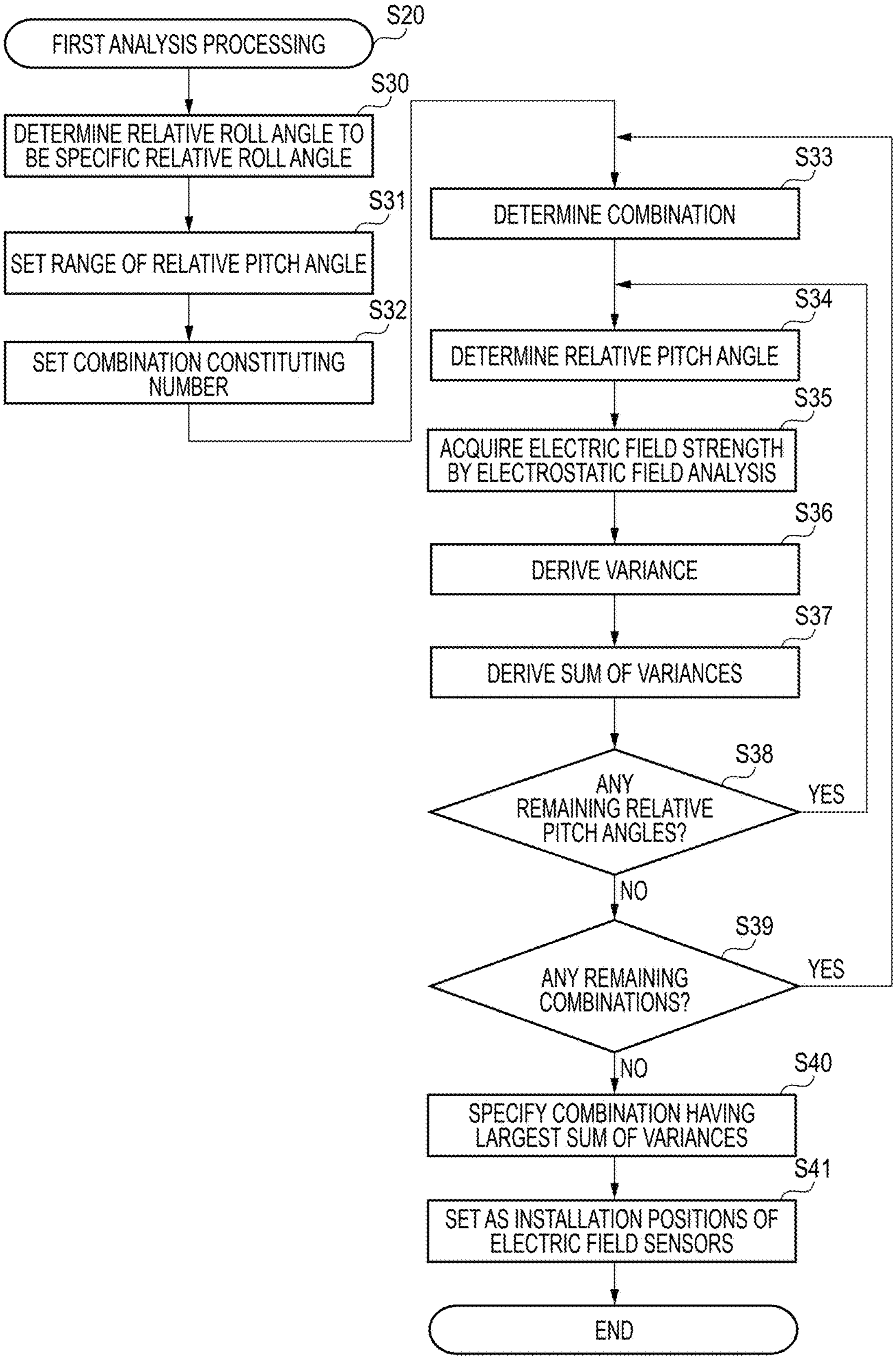
FIG. 11 is a flowchart illustrating a flow of the first analysis processing.

FIG. 11 is a flowchart illustrating a flow of the first analysis processing (S20). When the first analysis processing (S20) is started, the first analysis processing unit 92 first determines the relative roll angle to be a specific relative roll angle, such as zero (S30). Although not illustrated in FIG. 11, the relative yaw angle is also determined to be a specific relative yaw angle such as zero.

Next, the first analysis processing unit 92 sets a change range of the relative pitch angle (S31). The change range of the relative pitch angle is set within a realistic range that can be actually taken in the attitude control of the aircraft 1.

Next, the first analysis processing unit 92 sets the combination constituting number (S32). For example, the first analysis processing unit 92 sets four as the combination constituting number. The combination constituting number is not limited to four, and may be set to any number equal to or greater than two.

Next, the first analysis processing unit 92 extracts the candidate positions 102 in the combination constituting number set in step S32 from the candidate positions 102, and determines a combination of the combination constituting number of the candidate positions 102 (S33).

Next, the first analysis processing unit 92 determines any relative pitch angle within the change range of the relative pitch angle (S34).

The first analysis processing unit 92 executes the electrostatic field analysis at the determined relative pitch angle, and acquires the electric field strength at each of the candidate positions 102 constituting the combination determined in step S33 (S35). The first analysis processing unit 92 may store the relative pitch angle, the candidate position 102 from which the electric field strength has been acquired, and the acquired electric field strength in association with one another.

The first analysis processing unit 92 derives an average value of the acquired electric field strength, and derives a variance of the electric field strength of the candidate positions 102 constituting the combination based on the average value (S36). The first analysis processing unit 92 derives a sum of variances derived when the combination of candidate positions is the same and the relative pitch angle is the same (S37). For example, the first analysis processing unit 92 derives a sum of variances by adding a variance derived this time to a variance derived previously when the combination of candidate positions 102 is the same and the relative pitch angle is the same.

Next, the first analysis processing unit 92 determines whether there are any remaining relative pitch angles for which the electrostatic field analysis has not been performed (S38). If there are any remaining relative pitch angles (YES in S38), the first analysis processing unit 92 repeats the processes from step S34 onwards. At this time, the first analysis processing unit 92 determines any relative pitch angle from among the remaining relative pitch angles (S34), and again acquires the electric field strength at the relative pitch angle which is changed in this way (S35).

If there are no remaining relative pitch angles (NO in S38), the first analysis processing unit 92 determines whether there are any remaining combinations that have not been combined (S39). If there are remaining combinations (YES in S39), the first analysis processing unit 92 repeats the processes from step S33 onwards. At this time, the first analysis processing unit 92 determines any combination among the remaining combinations (S33), and repeats the processes from the determination of the relative pitch angle onward for the combination which is changed in this way.

If there are no remaining combinations (NO in S39), the first analysis processing unit 92 identify a combination having the largest sum of variances (S40). The first analysis processing unit 92 sets the candidate positions 102 constituting the combination identified in step S40 as the installation positions of the electric field sensors (S41), and ends the first analysis processing.

Figure 12:
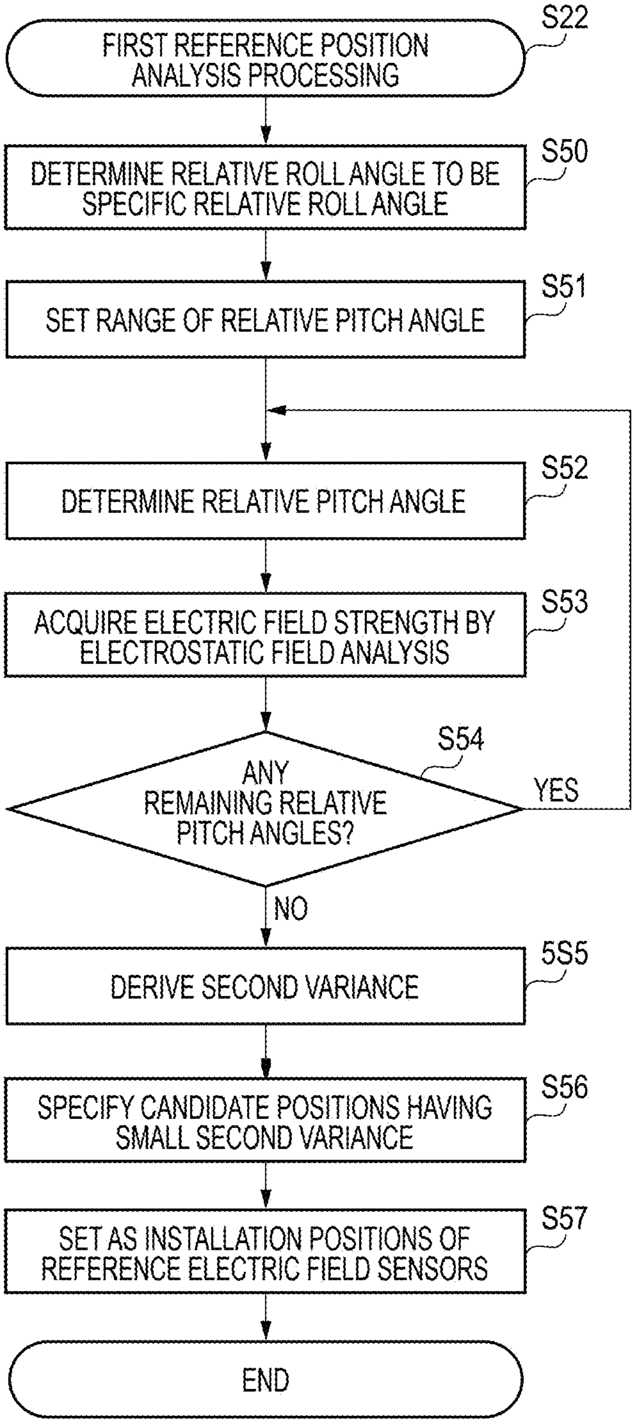
FIG. 12 is a flowchart illustrating a flow of first reference position analysis processing.

FIG. 12 is a flowchart illustrating a flow of the first reference position analysis processing (S22). When the first reference position analysis processing (S22) is started, the first analysis processing unit 92 first determines the relative roll angle to be a specific relative roll angle, such as zero (S50). Although not illustrated in FIG. 12, the relative yaw angle is also determined to be a specific relative yaw angle such as zero.

Next, the first analysis processing unit 92 sets a change range of the relative pitch angle (S51). The change range of the relative pitch angle is set within a realistic range that can be actually taken in the attitude control of the aircraft 1.

The first analysis processing unit 92 determines any relative pitch angle within the change range of the relative pitch angle (S52).

The first analysis processing unit 92 executes an electrostatic field analysis at the determined relative pitch angle, and acquires the electric field strength at each of the candidate positions 102 (S53). The first analysis processing unit 92 may store the relative pitch angle, the candidate position 102 from which the electric field strength has been acquired, and the acquired electric field strength in association with one another.

Next, the first analysis processing unit 92 determines whether there are any remaining relative pitch angles for which the electrostatic field analysis has not been performed (S54). If there are any remaining relative pitch angles (YES in S54), the first analysis processing unit 92 repeats the processes from step S32 onwards. At this time, the first analysis processing unit 92 determines any relative pitch angle from among the remaining relative pitch angles (S52), and again acquires the electric field strength at the relative pitch angle which is changed in this way (S53).

If there are no remaining relative pitch angles (NO in S54), the first analysis processing unit 92 derives the second variance of the electric field strength with respect to the relative pitch angle (S55). For example, the first analysis processing unit 92 derives the second variance of the electric field strength at any candidate position 102 by subtracting the minimum value from the maximum value of the electric field strength at the any candidate position 102 and taking the absolute value, and derives second variances of the electric field strength at all the candidate positions 102 in the same manner.

Next, the first analysis processing unit 92 identifies candidate positions 102 for which the second variance of the electric field strength derived in step S55 is relatively small (S56). For example, the first analysis processing unit 92 identifies the candidate position 102 having the smallest second variance of the electric field strength among the candidate positions 102. The first analysis processing unit 92 sets the candidate positions 102 identified in step S56 as the installation positions of the reference electric field sensors (S57), and ends the first reference position analysis processing (S22).

Figure 13:
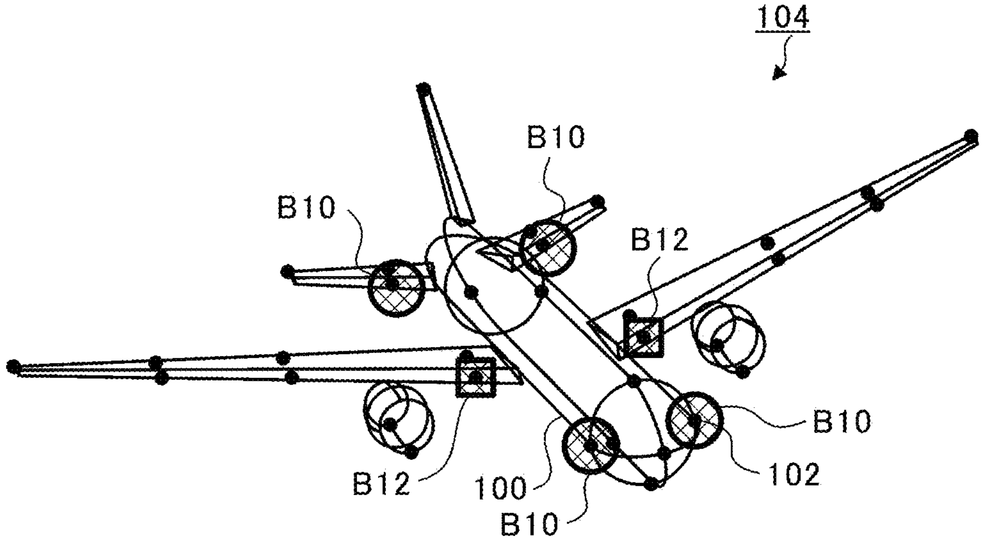
FIG. 13 is a diagram illustrating an example of installation positions of electric field sensors determined by the first analysis processing and installation positions of reference electric field sensors determined by the first reference position analysis processing.

FIG. 13 is a diagram illustrating an example of the installation positions of the electric field sensors determined by the first analysis processing (S20) and the installation positions of the reference electric field sensors determined by the first reference position analysis processing (S22). In FIG. 13, hatched circle marks B10 indicate an example of the installation positions of the electric field sensors determined in step S41 in the first analysis processing. In FIG. 13, hatched square marks B12 indicate an example of the installation positions of the reference electric field sensors determined in step S57 in the first reference position analysis processing.

In the example of FIG. 13, as illustrated by the hatched circle marks B10 in FIG. 13, for example, a total of four positions on left and right nose sides on a nose side and undersides of the left and right horizontal stabilizers 14 of the aircraft 1 are determined as the installation positions of the electric field sensors. By actually installing the electric field sensors at these positions, the electric field strength can be effectively detected when the aircraft 1 performs the attitude control in the pitch direction, and the surface electric field strength distribution of the aircraft 1 can be more appropriately estimated.

In the example of FIG. 13, as illustrated by the hatched square marks B12 in FIG. 13, for example, positions between the fuselage 10 and engines on lower surfaces of the main wings 12 of the aircraft 1 are determined as the installation positions of the reference electric field sensors. By actually installing the reference electric field sensors at the positions, a reference of the electric field strength when the aircraft 1 performs the attitude control in the pitch direction becomes clear, and the electric field strength distribution of the aircraft 1 can be estimated more appropriately.

Figure 14:
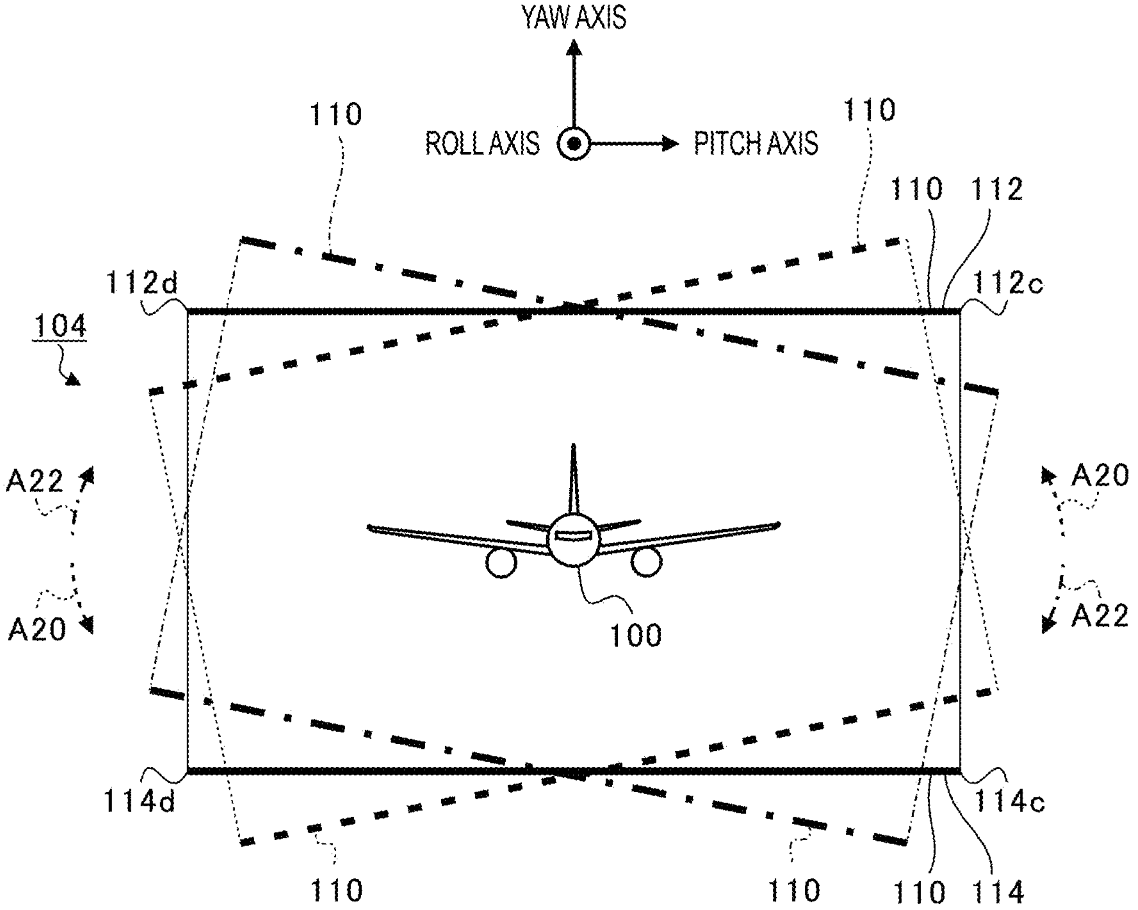
FIG. 14 is a diagram illustrating an outline of second analysis processing.

FIG. 14 is a diagram illustrating an outline of the second analysis processing (S24). FIG. 14 illustrates a state in which the airframe shape model 100 disposed in the analysis space 104 and the parallel electrodes 110 are viewed from the nose side of the airframe. In FIG. 14, for convenience of description, the airframe shape model 100 is exaggerated and illustrated large relative to the size of the analysis space 104. Further, in FIG. 14, for convenience of description, the roll axis, the pitch axis, and the yaw axis of the airframe shape model 100 are also illustrated.

In the example of FIG. 14, the parallel electrodes 110 indicated by thick solid lines are arranged parallel to the pitch axis and roll axis of the airframe shape model 100. At this time, the relative roll angle of the airframe shape model 100 with respect to the parallel electrodes 110 is zero.

Here, it is assumed that the position of the airframe shape model 100 is fixed, and the parallel electrodes 110 are rotated counterclockwise in FIG. 14 by a predetermined angle (for example, 10°) around the roll axis at the center of the analysis space 104 as the center of rotation as indicated by dashed arrows A20. An example of the parallel electrodes 110 at that time is indicated by a thick dashed line in FIG. 14. In this state, a left wing side end 112*c* of the upper electrode 112 and a left wing side end 114*c* of the lower electrode 114 are moved upward, and a right wing side end 112*d* of the upper electrode 112 and a right wing side end 114*d* of the lower electrode 114 are moved downward. In this case, when the rotated thick-dashed parallel electrodes 110 are used as a reference, the relative roll angle of the airframe shape model 100 becomes a value on a left bank side of zero.

Here, it is assumed that the position of the airframe shape model 100 is fixed, and the parallel electrodes 110 are rotated clockwise in FIG. 14 by a predetermined angle (for example,) 10° around the roll axis at the center of the analysis space 104 as the center of rotation as indicated by dot-dash-line arrows A22. An example of the parallel electrodes 110 at that time is indicated by thick dot-dash-lines in FIG. 14. In this state, the left wing side end 112*c* of the upper electrode 112 and the left wing side end 114*c* of the lower electrode 114 are moved downward, and the right wing side end 112*d* of the upper electrode 112 and the right wing side end 114*d* of the lower electrode 114 are moved upward. In this case, when the rotated parallel electrodes 110 indicated by the thick dot-dash-lines are used as a reference, the relative roll angle of the airframe shape model 100 is a value on a right bank side of zero.

In this manner, the relative roll angle can be changed by rotating the parallel electrodes 110 around the roll axis. Here, an example has been described in which the airframe shape model 100 is fixed and the parallel electrodes 110 are rotated, but the positions of the parallel electrodes 110 may be fixed and the airframe shape model 100 may be rotated around the roll axis to change the relative roll angle. However, in the example in which the airframe shape model 100 is rotated, tetrahedrons corresponding to the candidate positions 102 change one by one as the airframe shape model 100 is rotated, and thus the electrostatic field analysis is more time-consuming and complicated than the example in which the parallel electrodes 110 are rotated. Therefore, the example in which the parallel electrodes 110 are rotated is more preferable than the example in which the airframe shape model 100 is rotated.

In the second analysis processing, the relative pitch angle and the relative yaw angle are fixed at predetermined values, respectively. The second analysis processing unit 94 extracts any four candidate positions 102 from the candidate positions 102, and creates a combination of the four candidate positions 102.

The second analysis processing unit 94 determines the relative roll angle to any value, generates the electric field between the parallel electrodes 110, and acquires the electric field strength at each candidate position 102 in the combination of the four candidate positions 102 by the electrostatic field analysis. Further, the second analysis processing unit 94 changes the relative roll angle while maintaining the relative pitch angle and the relative yaw angle at the predetermined values, and repeats the process of acquiring the electric field strength at each of the candidate positions 102 each time the relative roll angle is changed. For example, the second analysis processing unit 94 changes the relative roll angle by 1° while maintaining the relative pitch angle and the relative yaw angle at zero. The relative roll angle is not limited to being changed by 1°, and may be changed by any angle.

When these processes are performed, the electric field strength is obtained for each of the candidate positions 102 in the combination of the four candidate positions 102 for each relative roll angle. The electric field strength at each candidate position 102 is different for each relative roll angle.

The second analysis processing unit 94 derives a variance based on the electric field strength of each of the candidate positions 102 in the combination of the four candidate positions 102 at any relative roll angle. Here, a method for deriving the variance is the same as the method for deriving the variance in the first analysis processing unit 92. The second analysis processing unit 94 repeats the derivation of this variance each time the relative roll angle is changed. Further, the second analysis processing unit 94 adds variances derived each time the relative roll angle is changed, to derive a sum of the variances each time the relative roll angle is changed.

The second analysis processing unit 94 changes the combination of the four candidate positions 102 and derives the sum of the variances for each combination of the candidate positions 102. The second analysis processing unit 94 derives the sum of the variances for all patterns of combinations of the four candidate positions 102.

Figure 15:
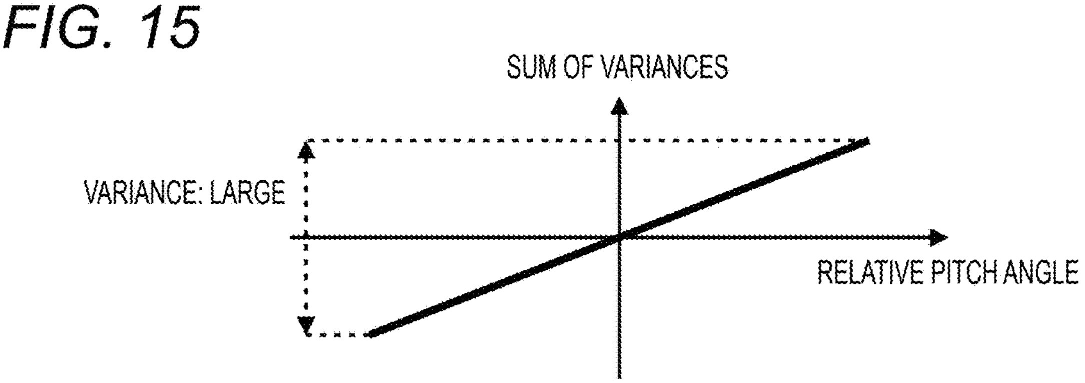
FIG. 15 is a diagram illustrating an example of a relationship between a relative roll angle and the sum of variances.
Figure 16:
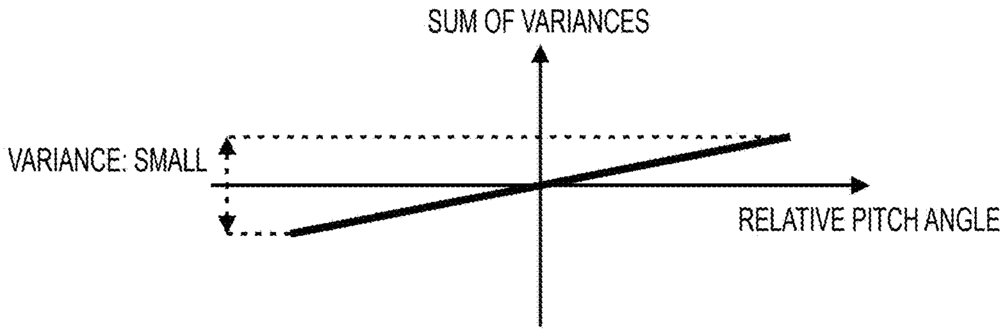
FIG. 16 is a diagram illustrating another example of the relationship between the relative roll angle and the sum of the variances.

FIG. 15 is a diagram illustrating an example of a relationship between the relative roll angle and the sum of variances. FIG. 15 illustrates an example in which the sum of the variances with respect to the relative roll angle is relatively large. FIG. 16 is a diagram illustrating another example of the relationship between the relative roll angle and the sum of the variances.

The second analysis processing unit 94 identifies a combination of four candidate positions 102 that has the largest sum of variances with respect to the relative roll angle, and sets each candidate position 102 that constitutes the identified combination of the four candidate positions 102 as the installation position of the electric field sensor.

As described above, by setting each candidate position 102 that constitutes the combination of the candidate positions 102 having the largest sum of variances as the installation position of the electric field sensor, the installed electric field sensor can effectively detect the electric field strength.

Next, an outline of the second reference position analysis processing will be described. In the second reference position analysis processing, the relative pitch angle and the relative yaw angle are fixed to predetermined values, respectively, and the relative roll angle is determined to any value. In this state, the second analysis processing unit 94 generates the electric field between the parallel electrodes 110 and acquires the electric field strength at each of the candidate positions 102 by the electrostatic field analysis. Further, the second analysis processing unit 94 changes the relative roll angle while maintaining the relative pitch angle and the relative yaw angle at the predetermined values, and repeats the process of acquiring the electric field strength at each of the candidate positions 102 each time the relative roll angle is changed. For example, the second analysis processing unit 94 changes the relative roll angle by 1° while maintaining the relative pitch angle and the relative yaw angle at zero. The relative roll angle is not limited to being changed by 1°, and may be changed by any angle.

When these processes are performed, the electric field strength is acquired for each relative roll angle at each candidate position 102. The electric field strength at each candidate position 102 is different for each relative roll angle.

Figure 17:
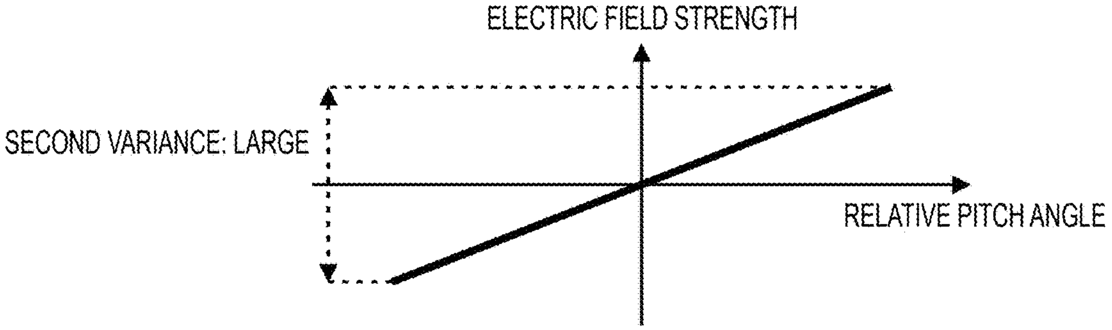
FIG. 17 is a diagram illustrating an example of a relationship between a relative roll angle and electric field strength at one candidate position.
Figure 18:
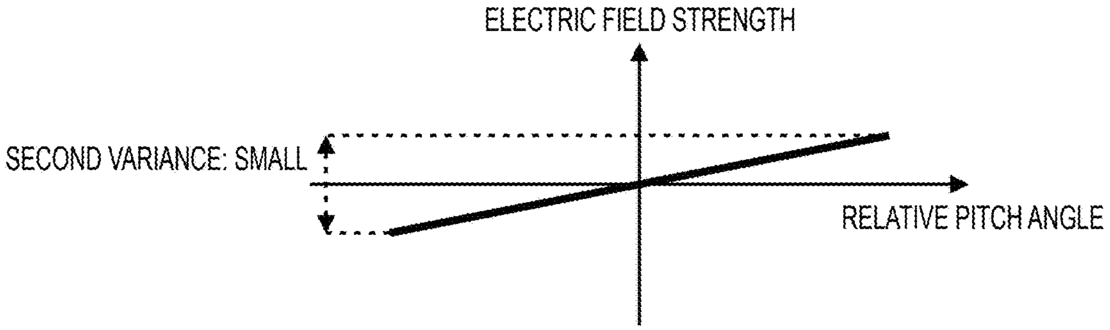
FIG. 18 is a diagram illustrating an example of a relationship between a relative roll angle and electric field strength at another candidate position.

FIG. 17 is a diagram illustrating an example of a relationship between the relative roll angle and the electric field strength at one candidate position 102. FIG. 18 is a diagram illustrating an example of a relationship between a relative roll angle and electric field strength at another candidate position 102.

Here, at any one of the candidate positions 102, a difference value obtained by subtracting a minimum value from a maximum value of the electric field strength acquired for each relative roll angle and taking an absolute value is defined as a second variance of the electric field strength with respect to the relative roll angle. In other words, the second variance of the electric field strength with respect to the relative roll angle corresponds to amplitude of the electric field strength when the electric field strength is obtained by changing the relative roll angle.

FIG. 17 illustrates an example in which the second variance of the electric field strength with respect to the relative roll angle is relatively large. FIG. 18 illustrates an example in which the second variance of the electric field strength with respect to the relative roll angle is relatively small.

The second analysis processing unit 94 may identify candidate positions 102 having a relatively small second variance of the electric field strength with respect to the relative roll angle among the candidate positions 102, and may set the identified candidate positions 102 as the installation positions of the reference electric field sensors. The reference electric field sensor is an electric field sensor that detects the reference electric field strength serving as the reference of the electric field strength.

As described above, the phrase that the second variance of the electric field strength is small means that if the reference electric field sensor is installed at that position, the change in the electric field strength detected by the reference electric field sensor is small even if the roll angle of the aircraft 1 actually changes. In this case, the electric field strength detected by the reference electric field sensor can be made approximately constant within the allowable error range, regardless of an actual roll angle of the aircraft 1. By using the electric field strength detected by this reference electric field sensor as the reference of the electric field strength, it becomes possible to more appropriately estimate the surface electric field strength distribution of the aircraft 1.

In one example, the second analysis processing unit 94 may identify a predetermined number of candidate positions 102 from those having the smallest second variance among the candidate positions 102, and may determine the identified predetermined number of candidate positions 102 as the installation positions of the electric field sensors. By identifying the candidate positions 102 for the installation positions of the reference electric field sensors from those having the smallest second variance, it is possible to reduce the fluctuation in the electric field strength detected by the reference electric field sensor, and it is possible to more appropriately estimate the surface electric field strength distribution.

The predetermined number here may be, for example, one. If there is at least one reference electric field strength, the surface electric field strength distribution can be appropriately estimated. The predetermined number is not limited to one, but may be set to any number equal to or greater than two.

Figure 19:
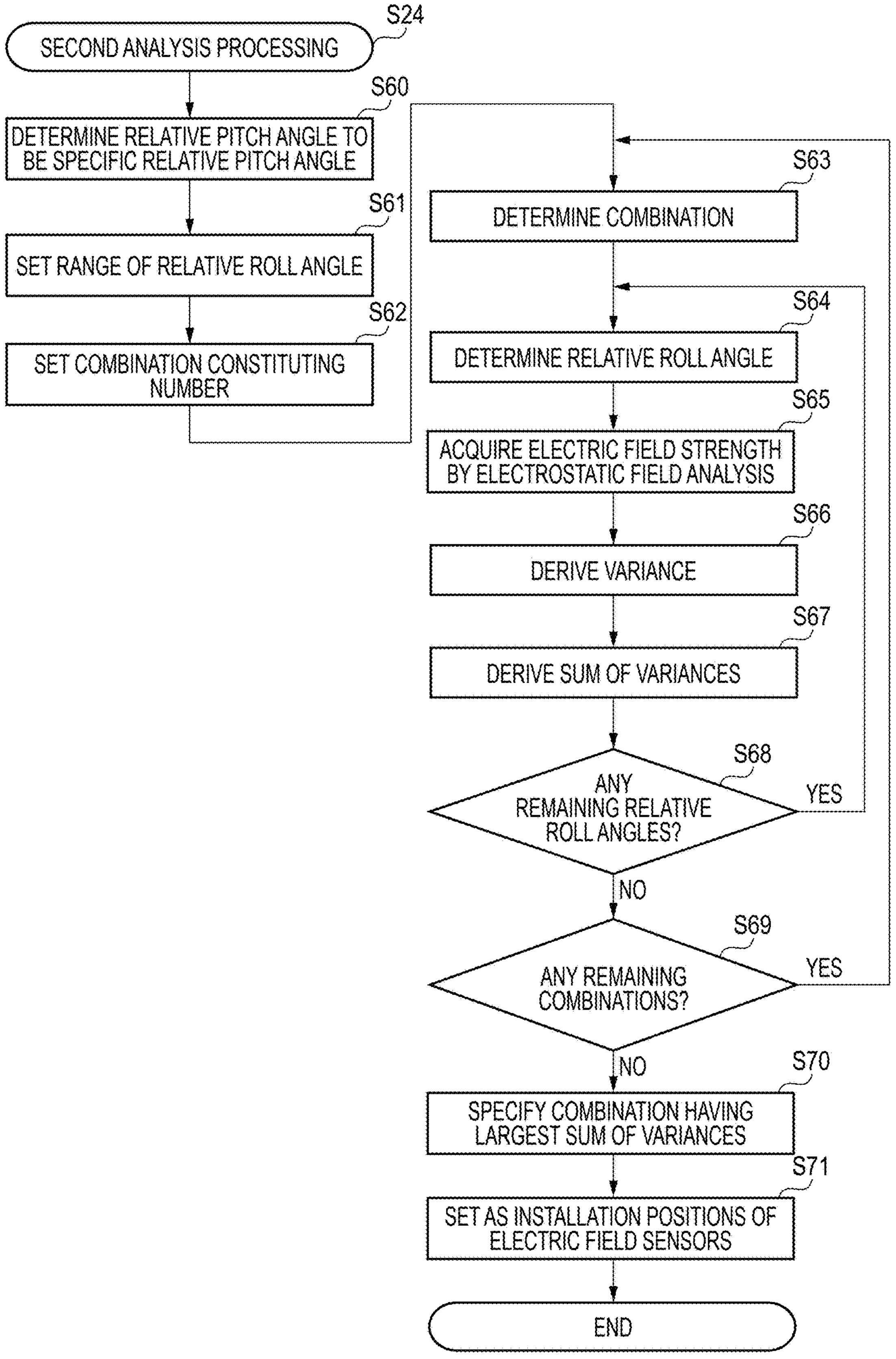
FIG. 19 is a flowchart illustrating a flow of the second analysis processing.

FIG. 19 is a flowchart illustrating a flow of the second analysis processing (S24). When the second analysis processing (S24) is started, the second analysis processing unit 94 first determines the relative pitch angle to be a specific relative pitch angle, such as zero (S60). Although not illustrated in FIG. 19, the relative yaw angle is also determined to be a specific relative yaw angle such as zero.

Next, the second analysis processing unit 94 sets a change range of the relative roll angle (S61). The change range of the relative roll angle is set within a realistic range that can be actually taken in the attitude control of the aircraft 1.

Next, the second analysis processing unit 94 sets the combination constituting number (S62). For example, the second analysis processing unit 94 sets four as the combination constituting number. The combination constituting number is not limited to four, and may be set to any number equal to or greater than two.

Next, the second analysis processing unit 94 extracts the candidate positions 102 in the combination constituting number set in step S62 from the candidate positions 102, and determines a combination of the combination constituting number of the candidate positions 102 (S63).

Next, the second analysis processing unit 94 determines any relative roll angle within the change range of the relative roll angle (S64).

The second analysis processing unit 94 executes the electrostatic field analysis at the determined relative roll angle, and acquires the electric field strength at each of the candidate positions 102 constituting the combination determined in step S63 (S65). The second analysis processing unit 94 may store the relative roll angle, the candidate position 102 from which the electric field strength has been acquired, and the acquired electric field strength in association with one another.

The second analysis processing unit 94 derives an average value of the acquired electric field strength, and derives a variance of the electric field strength of the candidate positions 102 constituting the combination based on the average value (S66). The second analysis processing unit 94 derives a sum of variances derived when the combination of candidate positions is the same and the relative roll angle is the same (S67). For example, the second analysis processing unit 94 derives a sum of variances by adding a variance derived this time to a variance derived previously when the combination of candidate positions 102 is the same and the relative roll angle is the same.

Next, the second analysis processing unit 94 determines whether there are any remaining relative roll angles for which the electrostatic field analysis has not been performed (S68). If there are any remaining relative roll angles (YES in S68), the second analysis processing unit 94 repeats the processes from step S64 onwards. At this time, the second analysis processing unit 94 determines any relative roll angle from among the remaining relative roll angles (S64), and again acquires the electric field strength at the relative roll angle which is changed in this way (S65).

If there are no remaining relative roll angles (NO in S68), the second analysis processing unit 94 determines whether there are any remaining combinations that have not been combined (S69). If there are remaining combinations (YES in S69), the second analysis processing unit 94 repeats the processes from step S63 onwards. At this time, the second analysis processing unit 94 determines any combination among the remaining combinations (S64), and repeats the processes from the determination of the relative roll angle onward for the combination which is changed in this way.

If there are no remaining combinations (NO in S69), the second analysis processing unit 94 identifies a combination having the largest sum of variances (S70). The second analysis processing unit 94 determines the candidate positions 102 constituting the combination identified in step S70 as the installation positions of the electric field sensors (S71), and ends the second analysis processing.

Figure 20:
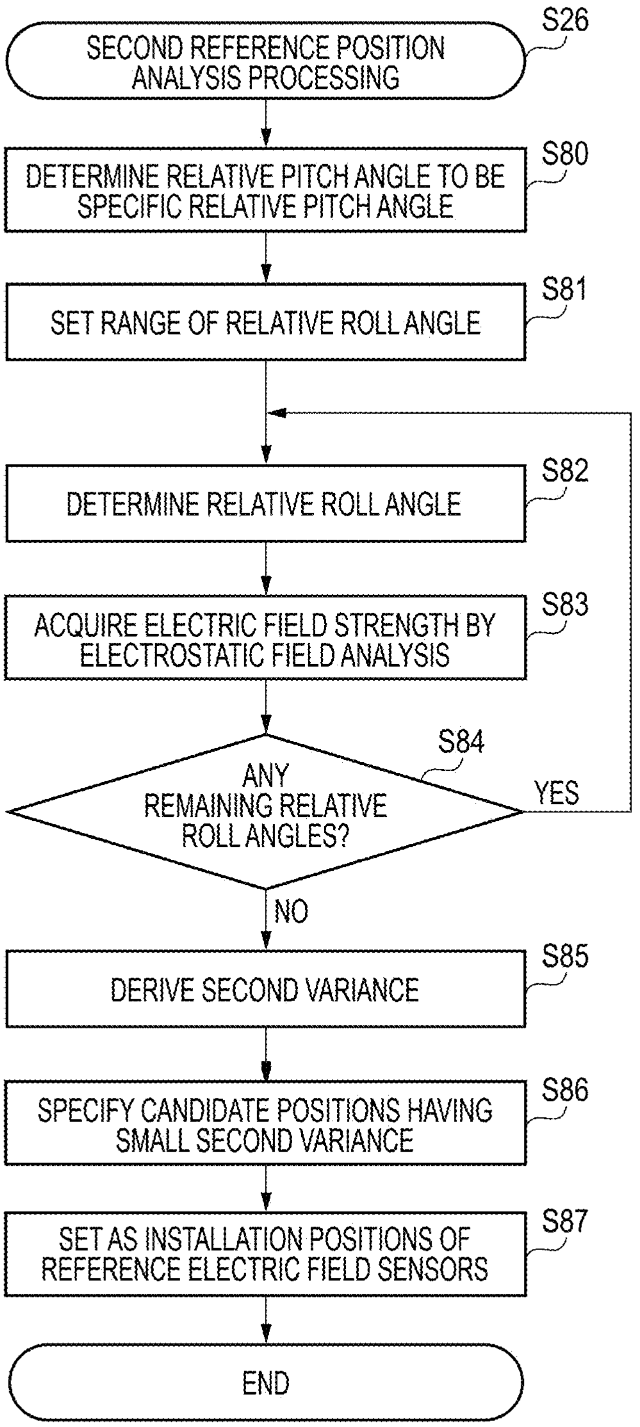
FIG. 20 is a flowchart illustrating a flow of second reference position analysis processing.

FIG. 20 is a flowchart illustrating a flow of the second reference position analysis processing (S26). When the second reference position analysis processing (S26) is started, the second analysis processing unit 94 first determines the relative pitch angle to be a specific relative pitch angle, such as zero (S80). Although not illustrated in FIG. 20, the relative yaw angle is also determined to be a specific relative yaw angle such as zero.

Next, the second analysis processing unit 94 sets a change range of the relative roll angle (S81). The change range of the relative roll angle is set within a realistic range that can be actually taken in the attitude control of the aircraft 1.

The second analysis processing unit 94 determines any relative roll angle within the change range of the relative roll angle (S82).

The second analysis processing unit 94 executes the electrostatic field analysis at the determined relative roll angle, and acquires the electric field strength at each of the candidate positions 102 (S83). The second analysis processing unit 94 may store the relative roll angle, the candidate position 102 from which the electric field strength has been acquired, and the acquired electric field strength in association with one another.

Next, the second analysis processing unit 94 determines whether there are any remaining relative roll angles for which the electrostatic field analysis has not been performed (S84). If there are any remaining relative roll angles (YES in S84), the second analysis processing unit 94 repeats the processes from step S82 onwards. At this time, the second analysis processing unit 94 determines any relative roll angle from among the remaining relative roll angles (S82), and again acquires the electric field strength at the relative roll angle which is changed in this way (S83).

If there are no remaining relative roll angles (NO in S84), the second analysis processing unit 94 derives the second variance of the electric field strength with respect to the relative roll angle (S85). For example, the second analysis processing unit 94 derives the second variance of the electric field strength at any candidate position 102 by subtracting the minimum value from the maximum value of the electric field strength at the any candidate position 102 and taking the absolute value, and derives the second variances of the electric field strength at all the candidate positions 102 in the same manner.

Next, the second analysis processing unit 94 identifies candidate positions 102 for which the second variance of the electric field strength derived in step S85 is relatively small (S86). For example, the second analysis processing unit 94 identifies the candidate position 102 having the smallest second variance of the electric field strength among the candidate positions 102. The second analysis processing unit 94 sets the candidate positions 102 identified in step S86 as the installation positions of the reference electric field sensors (S87), and ends the second reference position analysis processing (S26).

Figure 21:
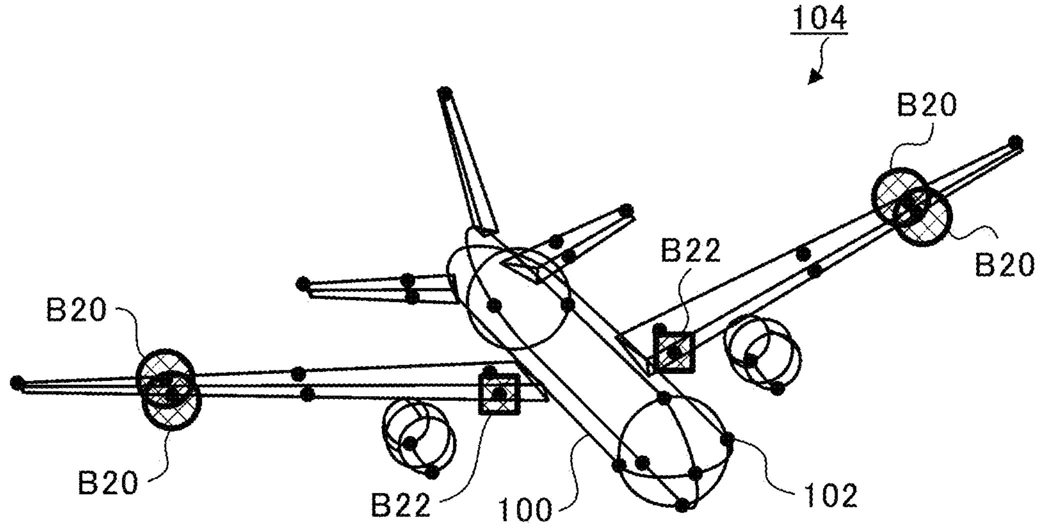
FIG. 21 is a diagram illustrating an example of installation positions of electric field sensors determined by the second analysis processing and installation positions of reference electric field sensors determined by the second reference position analysis processing.

FIG. 21 is a diagram illustrating an example of the installation positions of the electric field sensors determined by the second analysis processing (S24) and the installation positions of the reference electric field sensors determined by the second reference position analysis processing (S26). In FIG. 21, hatched circle marks B20 indicate an example of the installation positions of the electric field sensors determined in step S71 in the second analysis processing. In FIG. 21, hatched square marks B22 indicate an example of the installation positions of the reference electric field sensors determined in step S87 in the second reference position analysis processing.

In the example of FIG. 21, as illustrated by the hatched circle marks B20 in FIG. 21, for example, a total of four positions closer to tips than the fuselage 10 on upper surfaces and the lower surfaces of the left and right main wings 12 of the aircraft 1 are determined as the installation positions of the electric field sensors. By actually installing the electric field sensors at these positions, the electric field strength can be effectively detected when the aircraft 1 performs the attitude control in the roll direction, and the surface electric field strength distribution of the aircraft 1 can be more appropriately estimated.

In the example of FIG. 21, as illustrated by the hatched square marks B22 in FIG. 21, for example, positions between the fuselage 10 and engines on the lower surfaces of the main wings 12 of the aircraft 1 are determined as the installation positions of the reference electric field sensors. By actually installing the reference electric field sensors at the positions, the reference of the electric field strength when the aircraft 1 performs the attitude control in the roll direction becomes clear, and the electric field strength distribution of the aircraft 1 can be estimated more appropriately.

In the above description, by the first analysis processing, appropriate installation positions of the electric field sensors with respect to the relative pitch angle are determined, and by the second analysis processing, appropriate installation positions of the electric field sensors with respect to the relative roll angle are determined. In consideration of these, it is preferable to actually install the electric field sensors at both the installation positions determined by the first analysis processing and the installation positions determined by the second analysis processing. The electric field sensor may be actually installed at at least one of the installation position determined by the first analysis processing and the installation position determined by the second analysis processing.

The arithmetic device 64 is not limited to a mode in which both the first analysis processing and the second analysis processing are performed, and may perform only one of the first analysis processing and the second analysis processing. Further, the mode in which both the first analysis processing and the second analysis processing are performed is not limited to a mode in which the second analysis processing is performed after the first analysis processing, and the second analysis processing may be performed first, and the first analysis processing may be performed after the second analysis processing.

The first reference position analysis processing and the second reference position analysis processing may be omitted.

The resent disclosure is not limited to a mode in which the electric field strength is acquired by fixing the relative pitch angle and changing the relative roll angle, or a mode in which the electric field strength is acquired by fixing the relative roll angle and changing the relative pitch angle, but may also acquire the electric field strength by changing both the relative pitch angle and the relative roll angle at once. However, in the mode in which both the relative pitch angle and the relative roll angle are changed at once, a sum of variances when the relative pitch angle is changed may be larger than a sum of variances when the relative roll angle is changed, and there is a possibility that accuracy in identifying a combination in which a sum of variances is a maximum value is reduced. Therefore, a mode in which either the relative pitch angle or the relative roll angle is fixed and the other is changed is more preferable than the mode in which both are changed at once.

As described above, in the sensor position determination method of the present embodiment, at least one of the relative pitch angle and the relative roll angle is changed, and the acquisition of the electric field strength at each candidate position 102 of the candidate positions 102 is repeated each time at least one of the relative pitch angle and the relative roll angle is changed. Then, in the sensor position determination method according to the present embodiment, among the candidate positions 102, a candidate position 102 having a relatively large variance of the electric field strength acquired each time at least one of the relative pitch angle and the relative roll angle is identified, and the identified candidate position 102 is set as a setting position of the electric field sensor.

Therefore, according to the sensor position determination method of the present embodiment, an appropriate installation position of the electric field sensor can be determined. As a result, by actually installing the electric field sensor at the determined installation position, the surface electric field strength distribution of the aircraft 1 can be appropriately estimated, making it possible to prevent the influence of the lightning strike.

Figure 22:
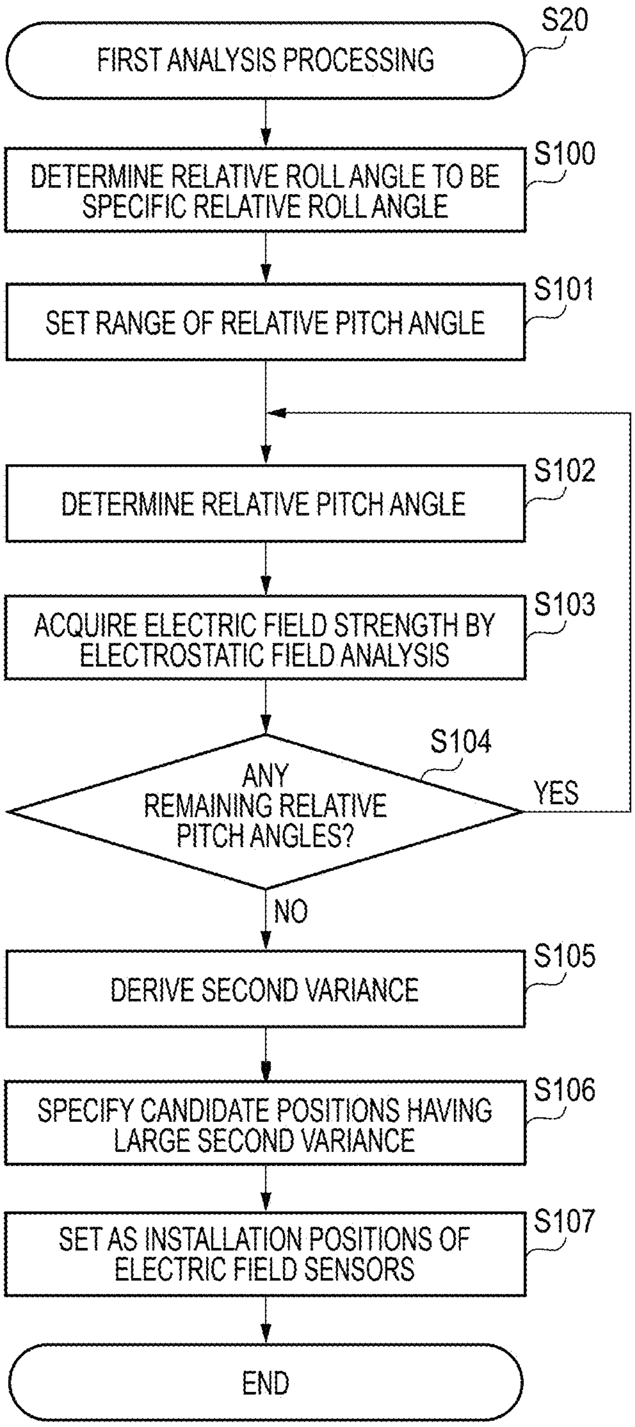
FIG. 22 is a flowchart illustrating another example of the first analysis processing.

FIG. 22 is a flowchart illustrating another example of the first analysis processing (S20). In FIG. 22, instead of determining the installation positions of the electric field sensors based on a sum of variances for each combination of the candidate positions 102, the installation positions of the electric field sensors are determined based on second variances of the electric field strength of the candidate positions 102.

When the first analysis processing (S20) is started, the first analysis processing unit 92 first determines the relative roll angle to be a specific relative roll angle, such as zero (S100). Although not illustrated in FIG. 22, the relative yaw angle is also determined to be a specific relative yaw angle such as zero. Next, the first analysis processing unit 92 sets a change range of the relative pitch angle (S101). The first analysis processing unit 92 determines any relative pitch angle within the change range of the relative pitch angle (S102).

The first analysis processing unit 92 executes the electrostatic field analysis at the determined relative pitch angle, and acquires the electric field strength at each of the candidate positions 102 (S103). The first analysis processing unit 92 may store the relative pitch angle, the candidate position 102 from which the electric field strength has been acquired, and the acquired electric field strength in association with one another.

Next, the first analysis processing unit 92 determines whether there are any remaining relative pitch angles for which the electrostatic field analysis has not been performed (S104). If there are any remaining relative pitch angles (YES in S104), the first analysis processing unit 92 repeats the processes from step S102 onwards. At this time, the first analysis processing unit 92 determines any relative pitch angle from among the remaining relative pitch angles (S102), and again acquires the electric field strength at the relative pitch angle which is changed in this way (S103).

If there are no remaining relative pitch angles (NO in S104), the first analysis processing unit 92 derives the second variance of the electric field strength with respect to the relative pitch angle (S105). For example, the first analysis processing unit 92 derives the second variance of the electric field strength at any candidate position 102 by subtracting the minimum value from the maximum value of the electric field strength at the any candidate position 102 and taking the absolute value, and derives the second variances of the electric field strength at all the candidate positions 102 in the same manner.

Next, the first analysis processing unit 92 identifies candidate positions 102 for which the second variance of the electric field strength derived in step S105 is relatively large (S106). For example, the first analysis processing unit 92 identifies a predetermined number of candidate positions 102 from those having the largest variance of the electric field strength among the candidate positions 102. The predetermined number is, for example, four, but is not limited to this example and may be set to any number. The first analysis processing unit 92 determines the candidate positions 102 identified in step S106 as the installation positions of the electric field sensors (S107).

The phrase that the second variance of the electric field strength is large means that if the electric field sensor is installed at that position, amplitude of the electric field strength that can be detected by the electric field sensor is large. The phrase that amplitude of the electric field strength that can be detected by the electric field sensor is large means that a ratio of noise to the electric field strength that can be detected by the electric field sensor is small, and resolution of the electric field sensor can be made higher than that of an electric field sensor at another position. Therefore, by setting the candidate positions 102 in which the second variance of the electric field strength is relatively large as the installation positions of the electric field sensors, it becomes possible to effectively detect the electric field strength by the installed electric field sensors.

Figure 23:
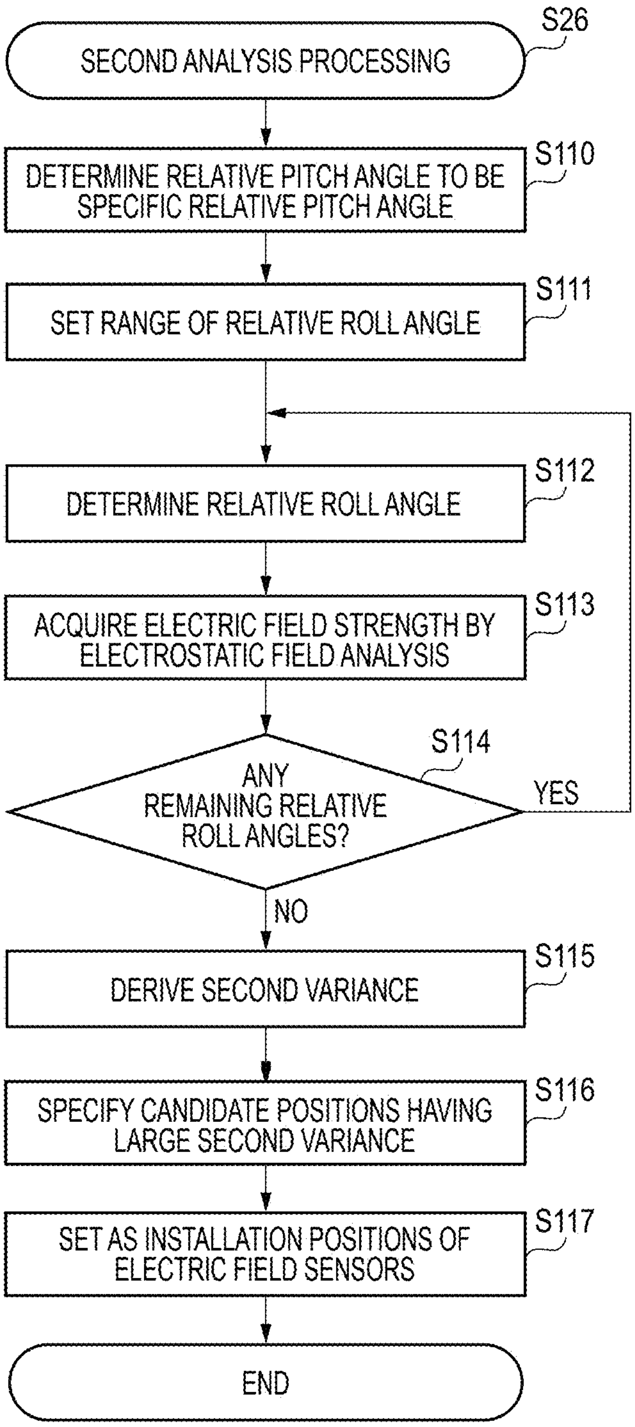
FIG. 23 is a flowchart illustrating another example of the second analysis processing.

FIG. 23 is a flowchart illustrating another example of the second analysis processing (S24). In FIG. 23, instead of determining the installation positions of the electric field sensors based on the sum of the variances for each combination of the candidate positions 102, the installation positions of the electric field sensors are determined based on the second variances of the electric field strength of the candidate positions 102.

When the second analysis processing (S24) is started, the second analysis processing unit 94 first determines the relative pitch angle to be a specific relative pitch angle, such as zero (S110). Although not illustrated in FIG. 23, the relative yaw angle is also determined to be a specific relative yaw angle such as zero. Next, the second analysis processing unit 94 sets a change range of the relative roll angle (S111).

The second analysis processing unit 94 executes the electrostatic field analysis at the determined relative roll angle, and acquires the electric field strength at each of the candidate positions 102 (S113). The second analysis processing unit 94 may store the relative roll angle, the candidate position 102 from which the electric field strength has been acquired, and the acquired electric field strength in association with one another.

Next, the second analysis processing unit 94 determines whether there are any remaining relative roll angles for which the electrostatic field analysis has not been performed (S114). If there are any remaining relative roll angles (YES in S114), the second analysis processing unit 94 repeats the processes from step S112 onwards. At this time, the second analysis processing unit 94 determines any relative roll angle from among the remaining relative roll angles (S112), and again acquires the electric field strength at the relative roll angle which is changed in this way (S113).

If there are no remaining relative roll angles (NO in S114), the second analysis processing unit 94 derives the second variance of the electric field strength with respect to the relative roll angle (S115). For example, the second analysis processing unit 94 derives the second variance of the electric field strength at any candidate position 102 by subtracting the minimum value from the maximum value of the electric field strength at the any candidate position 102 and taking the absolute value, and derives the second variances of the electric field strength at all the candidate positions 102 in the same manner.

Next, the second analysis processing unit 94 identifies candidate positions 102 for which the second variance of the electric field strength derived in step S115 is relatively large (S116). For example, the second analysis processing unit 94 identifies a predetermined number of candidate positions 102 from those having the largest second variance of the electric field strength among the candidate positions 102. The predetermined number is, for example, four, but is not limited to this example and may be set to any number. The second analysis processing unit 94 determines the candidate positions 102 identified in step S116 as the installation positions of the electric field sensors (S117).

The phrase that the second variance of the electric field strength is large means that if the electric field sensor is installed at that position, amplitude of the electric field strength that can be detected by the electric field sensor is large. The phrase that amplitude of the electric field strength that can be detected by the electric field sensor is large means that a ratio of noise to the electric field strength that can be detected by the electric field sensor is small, and resolution of the electric field sensor can be made higher than that of an electric field sensor at another position. Therefore, by setting the candidate positions 102 in which the second variance of the electric field strength is relatively large as the installation positions of the electric field sensors, it becomes possible to effectively detect the electric field strength by the installed electric field sensors.

Although the embodiments of the present disclosure have been described above with reference to the accompanying drawings, it goes without saying that the present disclosure is not limited to the embodiments. It is apparent to those skilled in the art that various modifications and alterations can be conceived within the scope of the claims, and it is understood that the modifications and alterations naturally fall within the technical scope of the present disclosure.

For example, in the above embodiment, the passenger plane is illustrated as the aircraft 1, and the installation positions of the electric field sensors to be installed on the passenger plane are determined. However, the sensor position determination method according to the present embodiment is not limited to a mode of determining the installation positions of the electric field sensors to be installed on the passenger plane. The sensor position determination method according to the present embodiment can determine the installation positions of the electric field sensors regardless of a type and a shape of the aircraft 1 on which the electric field sensors are installed.

In the above embodiment, in the pre-processing (S10), positions susceptible to the direct lightning stroke are excluded in advance from the candidate positions, and then the first analysis processing (S20), the first reference position analysis processing (S22), the second analysis processing (S24), and the second reference position analysis processing (S26) are performed. However, exclusion processing of excluding the positions susceptible to the direct lightning stroke from the candidate positions may not be performed in the pre-processing, but may be performed after the sum of the variances for all combinations is derived.

What is claimed is:

1. A sensor position determination method for determining an installation position of an electric field sensor that detects electric field strength generated on a surface of an airframe of an aircraft, the sensor position determination method comprising:

setting an airframe shape model that simulates a shape of the airframe in an analysis space in which an electrostatic field analysis is performed;

setting candidate positions serving as candidates for the installation position of the electric field sensor in the airframe shape model;

setting flat parallel electrodes that generate an electric field in the analysis space to sandwich the airframe shape model therebetween;

determining a relative pitch angle indicating a relative pitch angle of the airframe shape model relative to the parallel electrodes and a relative roll angle indicating a relative roll angle of the airframe shape model relative to the parallel electrodes;

acquiring the electric field strength at each of the candidate positions at the determined relative pitch angle and relative roll angle by the electrostatic field analysis;

repeating the acquisition of the electric field strength at each of the candidate positions by changing at least one of the relative pitch angle and the relative roll angle, each time the at least one of the relative pitch angle and the relative roll angle is changed; and identifying, from among the candidate positions, a candidate position having a relatively large variance of the electric field strength acquired each time the at least one of the relative pitch angle and the relative roll angle is changed, and setting the identified candidate position as the installation position of the electric field sensor.

2. The sensor position determination method according to claim 1, further comprising:

identifying, from among the candidate positions, a candidate position having a relatively small variance of the electric field strength acquired each time the at least one of the relative pitch angle and the relative roll angle is changed, and setting the identified candidate position as an installation position of a reference electric field sensor which is a electric field sensor that detects reference electric field strength serving as a reference of the electric field strength.

3. The sensor position determination method according to claim 2, further comprising:

excluding a position susceptible to direct lightning stroke in the airframe shape model from the candidate positions.

4. The sensor position determination method according to claim 1, further comprising:

excluding a position susceptible to direct lightning stroke in the airframe shape model from the candidate positions.

* * * * *